(12) United States Patent
Beeson et al.

(10) Patent No.: US 7,293,908 B2
(45) Date of Patent: Nov. 13, 2007

(54) SIDE EMITTING ILLUMINATION SYSTEMS INCORPORATING LIGHT EMITTING DIODES

(75) Inventors: Karl W. Beeson, Princeton, NJ (US); Scott M. Zimmerman, Basking Ridge, NJ (US)

(73) Assignee: Goldeneye, Inc., San Diego, CA (US)

( * ) Notice: Subject to any disclaimer, the term of this patent is extended or adjusted under 35 U.S.C. 154(b) by 189 days.

(21) Appl. No.: 11/253,174

(22) Filed: Oct. 18, 2005

(65) Prior Publication Data

US 2007/0086211 A1 Apr. 19, 2007

(51) Int. Cl.
*F21V 7/04* (2006.01)

(52) U.S. Cl. .............. 362/612; 362/230; 362/241; 362/300; 362/301; 362/555; 362/613; 362/800; 257/98; 257/99; 257/290

(58) Field of Classification Search ........... 362/612, 362/296–298, 613, 609, 555, 301, 300, 241, 362/230, 800; 257/98, 99, 290
See application file for complete search history.

(56) References Cited

U.S. PATENT DOCUMENTS

| | | | |
|---|---|---|---|
| 4,739,152 A * | 4/1988 | Downs | 392/421 |
| 5,410,454 A | 4/1995 | Murase et al. | |
| 6,144,536 A | 11/2000 | Zimmerman et al. | |
| 6,185,357 B1 | 2/2001 | Zou et al. | |
| 6,186,649 B1 | 2/2001 | Zou et al. | |
| 6,473,554 B1 | 10/2002 | Pelka et al. | |
| 6,550,942 B1 | 4/2003 | Zou et al. | |
| 6,641,293 B2 * | 11/2003 | Kumar et al. | 362/539 |
| 6,679,621 B2 | 1/2004 | West et al. | |
| 6,869,206 B2 | 3/2005 | Zimmerman et al. | |
| 7,055,991 B2 * | 6/2006 | Lin | 362/311 |
| 7,121,691 B2 * | 10/2006 | Coushaine et al. | 362/298 |
| 2003/0201451 A1 * | 10/2003 | Suehiro et al. | 257/98 |

* cited by examiner

*Primary Examiner*—Alan Cariaso
*Assistant Examiner*—Leah S. Lovell
(74) *Attorney, Agent, or Firm*—William Propp, Esq.

(57) ABSTRACT

The invention is a side-emitting illumination system that incorporates a light emitting diode. The side-emitting illumination system recycles a portion of the light internally generated by a light emitting diode back to the light emitting diode as externally incident light. The light emitting diode reflects the recycled light, thereby increasing the effective brightness of the light emitting diode. The light reflected by the light emitting diode is directed though the output aperture of the side-emitting illumination system, thereby increasing the output brightness and efficiency of the side-emitting illumination system. The light emitting diode reflects externally incident light with a reflectivity greater than 40 percent.

23 Claims, 16 Drawing Sheets

SIDE EMITTING ILLUMINATION SYSTEMS INCORPORATING LIGHT EMITTING DIODES

CROSS REFERENCE TO RELATED APPLICATION

This application is related to U.S. patent application Ser. No. 11/253175 entitled "LIGHT EMITTING DIODE WITH A SIDE EMITTING LENS", which is filed concurrently with this application and which is herein incorporated by reference.

TECHNICAL FIELD

The present invention is a side emitting illumination system that incorporates one or more light emitting diodes.

BACKGROUND

Light emitting diodes (LEDs) are rapidly replacing incandescent and fluorescent light sources in many illumination systems. LEDs emit light in the ultraviolet, visible and infrared regions of the optical spectrum. Gallium nitride (GaN) based LEDs, for example, emit light in the ultraviolet, blue, cyan and green spectral regions. AlGaInP LEDs emit light in the yellow and red regions of the optical spectrum.

Some illumination applications require a thin, low profile structure. For example, a backlight for a liquid crystal display (LCD) on a laptop computer or desktop computer monitor presently uses one or more thin cold cathode fluorescent lamps (CCFLs) that are coupled into a thin transparent optical waveguide. The waveguide is a solid plastic sheet that has surface features, such as grooves or roughened areas or white painted spots, which scatter light out of the waveguide to form a thin uniform source of light. The light exiting the backlight is directed predominately perpendicular to the plane of the waveguide. The light emitted by the thin planar waveguide is directed through the LCD panel to the person viewing the display. For relatively small displays, one can replace the CCFL light source with an array of LEDs that are positioned along the edges of the waveguide.

Larger displays, in particular LCD television displays, require a large area backlight. As the backlight become larger, it is no longer convenient to place LED light sources along the edges of the waveguide. When the LEDs are placed only along the edges of the waveguide, the edges of the display may be brighter than the center of the display, which is undesirable. In order to have a uniformly bright LED-based backlight, the LEDs must be embedded within holes scattered across the area of the waveguide. At each hole in the waveguide structure, a waveguide input surface surrounds an LED. A side emitting LED structure is desirable for these types of applications in order to direct the LED light into the input surface of the waveguide. Once the light is inside the waveguide, additional turning elements within the waveguide structure can redirect the light perpendicular to the plane of the waveguide and through the LCD panel.

For a very large LCD television such as a 37-inch or larger diagonal display, the solid plastic waveguide becomes very heavy and expensive. In addition, the plastic material such as acrylic that is used for the waveguide absorbs a considerable amount of blue light. For these very large displays, it is desirable to get rid of the plastic waveguide altogether and use a reflecting box that contains the light sources and is filled with air. However, the air filled box still needs to be thin. If LEDs are utilized as the light source, it is preferred that the LED structures be side emitting LED structures in order to spread the emitted light over a large area of the reflecting box and to prevent bright spots in the portions of the display directly in front of the LEDs. Light from the side emitting LED structures is redirected through the LCD panel by turning elements such as diffuse reflecting surfaces or angled reflectors.

An important parameter to consider in the design of LED-based LCD backlights is the reflectivity of the LEDs to externally incident light. Many commercially available LEDs, including the GaN-based LEDs made from GaN, InGaN, AlGaN and AlInGaN, have relatively low reflectivity to externally incident light. One reason for the low reflectivity is the high optical absorption of the LED semiconductor layers at the emitting wavelength of the internally generated light. Due to problems fabricating thin layers of the semiconductor materials, an absorption coefficient greater than 50 cm$^{-1}$ is typical.

Another reason for the low reflectivity of many present LED designs is that the LED die may include a substrate that absorbs a significant amount of light. For example, GaN-based LEDs with a silicon carbide substrate are usually poor light reflectors with an overall reflectivity of less than 40%.

An additional reason for the low reflectivity of many present LED designs is that the external structures on the LEDs, including the top metal electrodes, metal wire bonds and sub-mounts to which the LEDs are attached, are not designed for high reflectivity. For example, the top metal electrodes and wire bonds on many LEDs contain materials such as gold that have relatively poor reflectivity for light wavelengths less than about 550 nanometers. Reflectivity numbers on the order of 35% in the blue region of the optical spectrum are common for gold electrodes.

Due to the low reflectivity (less than 40%, for example) of many commercially available LEDs, illumination systems that incorporate such LEDs are designed to allow little or no light to return to the LEDs. Any light that is directed toward a poorly reflecting LED may be absorbed and lower the overall efficiency of the illumination system.

Some types of LEDs exist that have relatively high reflectivity, but such LEDs generally have low light extraction efficiency (for example, less than 25%). Illumination systems designed with such LEDs have low overall efficiency due to the low extraction efficiency of light from the LED structure.

It is possible to construct LEDs that have both high reflectivity to externally incident light and high light extraction efficiency. Examples of highly reflective, high efficiency LEDs are disclosed by Beeson and Zimmerman in U.S. patent application Ser. No. 10/952,112 entitled "LIGHT EMITTING DIODES EXHIBITING BOTH HIGH REFLECTIVITY AND HIGH LIGHT EXTRACTION" and in U.S. patent application Ser. No. 11/185,996 entitled "LIGHT EMITTING DIODES WITH IMPROVED LIGHT EXTRACTION AND REFLECTIVITY," both of which are herein incorporated by reference. LEDs are disclosed that do not require a large transparent optical element such as a hemispherical lens in order to achieve relatively high light extraction. Using such LEDs can allow illumination systems to be designed such that light is recycled back to the LED structures and is reflected by the LED structures. Light that is reflected by the LED sources will increase the effective brightness of the LED sources and increase the output brightness and efficiency of the illumination system. If both the LED reflectivity to externally incident light and the light extraction efficiency of the LED are high, a high efficiency, light recycling illumination system can be constructed.

LEDs with side emitting lenses are disclosed in U.S. Pat. No. 6,679,621. A complex lens having a curved reflective surface and curved and oblique angled refracting surfaces will reflect and refract light from an LED at an approximately right angle. However, the typical height of the side-emitting complex lens is 6 mm or larger. This relatively large size prevents the use of the side emitting lens in, for example, ultra-thin liquid crystal display (LCD) backlight structures that are thinner than about 6 mm. In order to produce ultra-thin illumination systems, it would be desirable to shorten or eliminate the lens but still retain high light extraction efficiency. U.S. Pat. No. 6,679,621 does not disclose low profile illumination systems that are thinner than about 6 mm and does not disclose recycling of emitted light back to the LEDs in order to increase the effective brightness of the LEDs and to increase the output brightness and efficiency of the illumination system.

Low profile illumination systems incorporating LEDs are disclosed in U.S. Pat. No. 6,473,554. Light exits the LED into a cusp-shaped reflector, is reflected approximately at right angles and then exits the reflector approximately parallel to the output surface of the LED. U.S. Pat. No. 6,473,554 does not disclose recycling of emitted light back to the LEDs in order to increase the effective brightness of the LEDs and to increase the output brightness and efficiency of the illumination system.

It would be desirable to develop side-emitting LED-based illumination systems that have a thin profile and that allow for light to be recycled back to the LED sources in order to increase the effective brightness of the LED sources and to increase the output brightness and efficiency of the illumination systems. For side-emitting illumination systems that incorporate LEDs having multiple colors or that incorporate wavelength conversion materials such as phosphors, it would be desirable to utilize light recycling in order to improve color mixing and to improve the color uniformity of the output light. Such side-emitting illumination systems can be used in applications such as LCD backlights that require a high-brightness, low profile illumination source.

SUMMARY OF THE INVENTION

One embodiment of this invention is a side-emitting illumination system that is comprised of a light emitting diode, a first reflector surrounding the light emitting diode, a second reflector that is separated from and opposite the first reflector and the light emitting diode, wherein the second reflector has an edge. The output aperture of the side-emitting illumination system is formed by the first reflector and the edge of the second reflector. A supporting means holds and separates the second reflector from the first reflector. The light emitting diode is comprised of a first doped semiconductor layer having an output surface, a second doped semiconductor layer, an active region interposed between the first doped semiconductor layer and the second doped semiconductor layer wherein the active region has electrical contact with both the first doped semiconductor layer and the second doped semiconductor layer, a first reflecting electrode in electrical contact with the first doped semiconductor layer and a second reflecting electrode in electrical contact with the second doped semiconductor layer. The first doped semiconductor layer and the second doped semiconductor layer have opposite n and p conductivity types. The active region of the light emitting diode emits internally generated light through the output surface of the first doped semiconductor layer when a voltage is applied between the first reflecting electrode and the second reflecting electrode. The internally generated light emitted through the output surface is directed to the second reflector of the side-emitting illumination system or is directed through the output aperture of the side-emitting illumination system. Internally generated light that is reflected by the second reflector is redirected through the output aperture of the side-emitting illumination system or is redirected to the first reflector or is recycled back to the light emitting diode as externally incident light. A portion of the externally incident light recycled back to the light emitting diode is reflected by the first reflecting electrode and the second reflecting electrode of the light emitting diode, thereby increasing the effective brightness of the light emitting diode, and is subsequently directed through the output aperture, thereby increasing the output brightness and efficiency of the side-emitting illumination system. The light emitting diode reflects externally incident light with a reflectivity greater than 40 percent.

In another embodiment of this invention, the side-emitting illumination system includes a waveguide. The waveguide has an input surface that substantially spans the output aperture and transmits light by total internal reflection.

In another embodiment of this invention, the waveguide is a flexible waveguide.

In another embodiment of this invention, the flexible waveguide is a plurality of flexible waveguides.

In another embodiment of this invention, the light emitting diode is a plurality of light emitting diodes. The plurality of light emitting diodes may emit more than one color of light.

Another embodiment of this invention includes a wavelength conversion layer. The wavelength conversion layer converts a portion of the internally generated light of a first color into light of a second color, different than the first color.

BRIEF DESCRIPTION OF THE DRAWINGS

A more detailed understanding of the present invention, as well as other objects and advantages thereof not enumerated herein, will become apparent upon consideration of the following detailed description and accompanying drawings, wherein:

FIG. 1A is a top plan view of a side-emitting illumination system of this invention. FIG. 1B is a cross-sectional side view along the I-I plane of the side-emitting illumination system illustrated in FIG. 1A. FIG. 1C is a cross-sectional side view along the II-II plane of the side-emitting illumination system illustrated in FIG. 1A. FIG. 1D is a cross-sectional side view along the II-II plane of the side-emitting illumination system illustrated in FIG. 1A showing an expanded cross-sectional view of the LED. FIGS. 1E-1I are cross-sectional side views along the II-II plane of the side-emitting illumination system shown in FIG. 1A and illustrate example light rays emitted by the LED.

FIG. 7C illustrates example light rays emitted by the LED.

DETAILED DESCRIPTION OF THE PREFERRED EMBODIMENTS

The preferred embodiments of the present invention will be better understood by those skilled in the art by reference to the above listed figures. The preferred embodiments of this invention illustrated in the figures are not intended to be exhaustive or to limit the invention to the precise form disclosed. The figures are chosen to describe or to best explain the principles of the invention and its applicable and practical use to thereby enable others skilled in the art to best utilize the invention. The above listed figures are not drawn to scale. In particular, the thickness dimension of the LEDs is expanded to better illustrate the various internal layers of the devices.

Figure 1A:
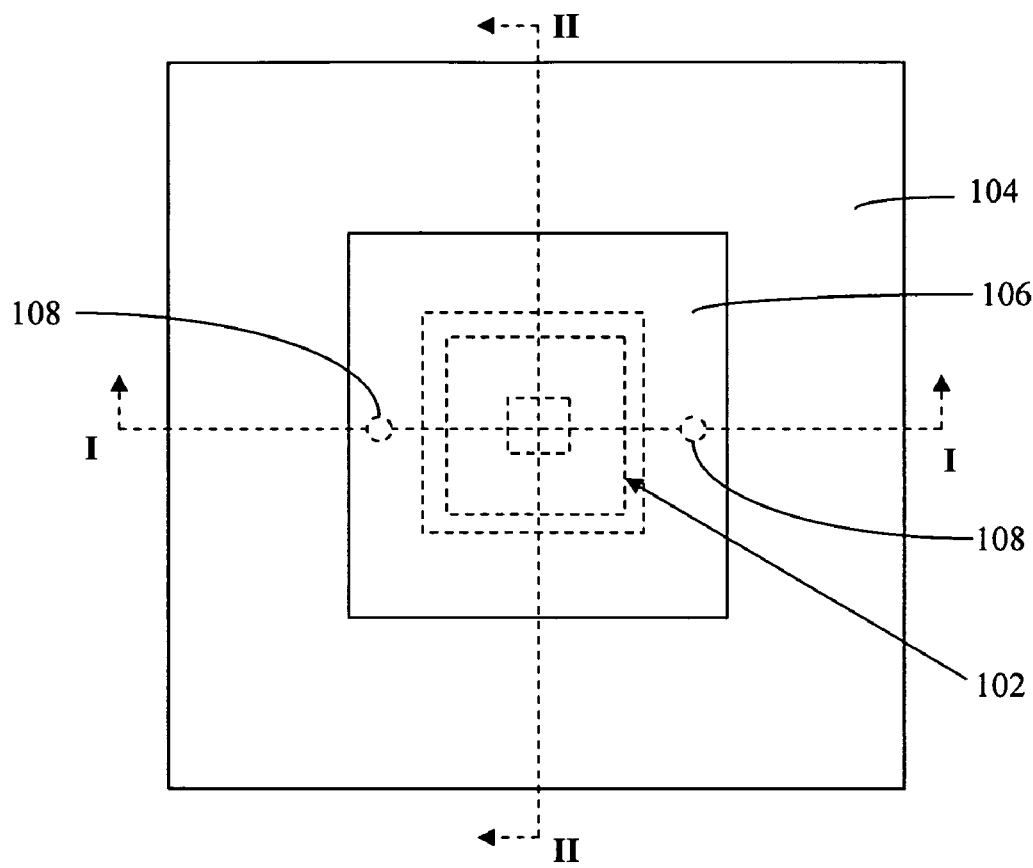
FIGS. 1A-1I are illustrations of one embodiment of a side-emitting illumination system of this invention.
Figure 1B:
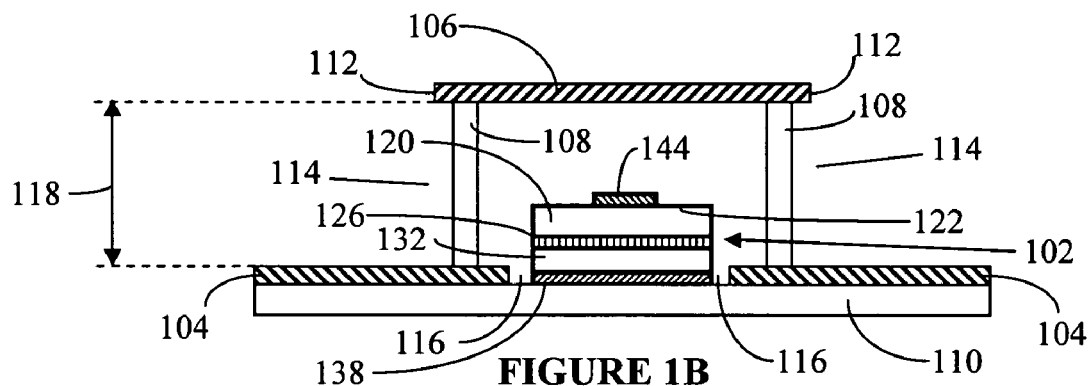
Figure 1C:
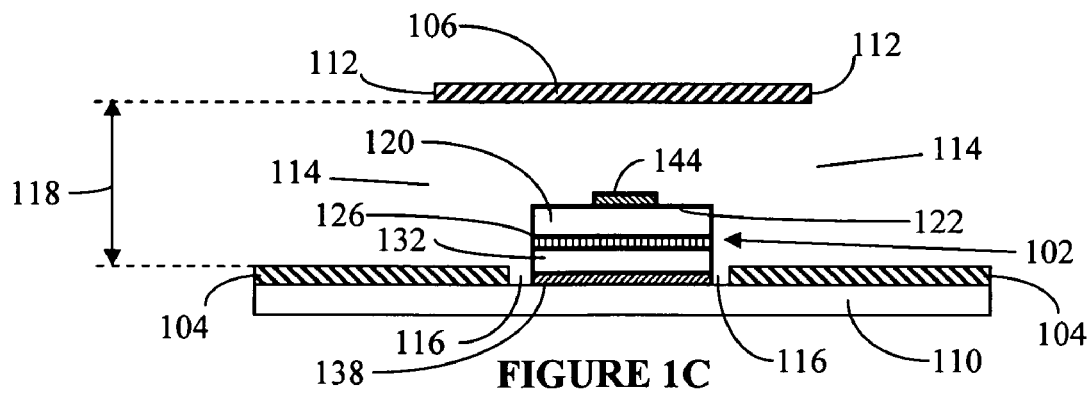
Figure 1D:
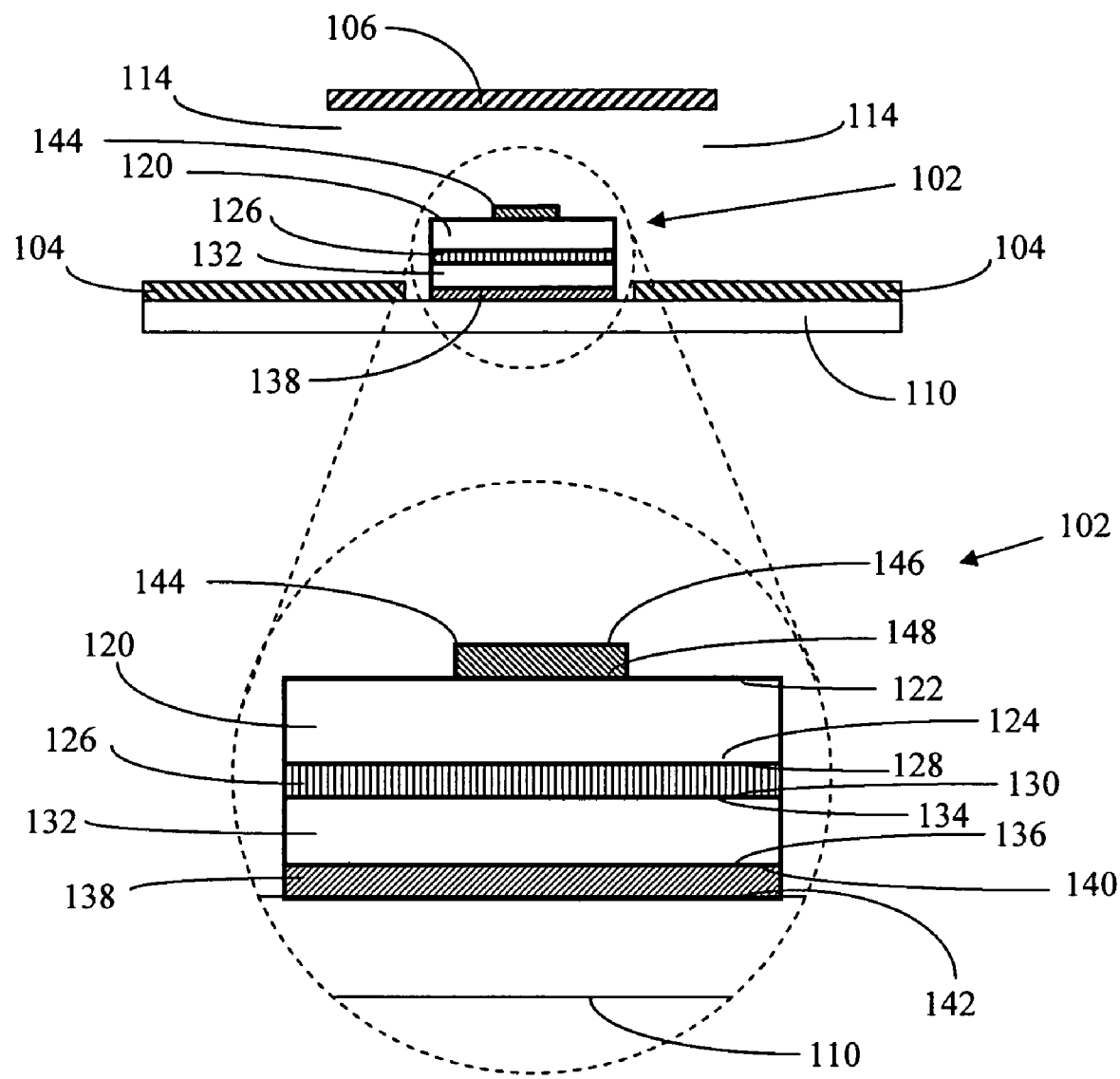

One embodiment of this invention is illustrated in FIGS. 1A-1I. FIG. 1A is a top plan view of side-emitting illumination system 100. FIG. 1B is a cross-sectional view along the I-I plan of the side-emitting illumination system 100 illustrated in FIG. 1A. FIG. 1C is a cross-sectional view along the II-II plane of the side-emitting illumination system 100 illustrated in FIG. 1A. FIG. 1D is a cross-sectional view along the II-II plane of the side-emitting illumination system 100 showing an expanded cross-sectional view of LED 102. FIGS. 1E-1I are cross-sectional views along the II-II plane of the side-emitting illumination system 100 shown in FIG. 1A and illustrate example light rays emitted by LED 102.

Side-emitting illumination system 100 is comprised of a LED 102, a first reflector 104, a second reflector 106 having edges 112, an output aperture 114 and supporting means that include posts 108 and a base 110.

In general, LED 102 includes a first reflecting electrode 144, a first doped semiconductor layer 120, an active region 126, a second doped semiconductor layer 132 and a second reflecting electrode 138. The first doped semiconductor layer 120 and the second doped semiconductor layer 132 have opposite n and p conductivity types. For example, if the first doped semiconductor layer 120 is an n-doped layer, then the second doped semiconductor layer 132 is a p-doped layer. Conversely, if the first doped semiconductor layer 120 is a p-doped layer, then the second doped semiconductor layer 132 is an n-doped layer.

The active region 126 is interposed between the first doped semiconductor layer 120 and the second doped semiconductor layer 132. The active region 126 is in electrical contact with both the first doped semiconductor layer 120 and the second doped semiconductor layer 132. The active region 126 of LED 102 is, for example, a p-n homojunction, a p-n heterojunction, a double heterojunction, a single quantum well or a multiple quantum well of the appropriate semiconductor material for the LED 102.

The first reflecting electrode 144 is in electrical contact with the first doped semiconductor layer 120. The second reflecting electrode 138 is in electrical contact with the second doped semiconductor layer 132. When a voltage is applied by electrical connections (not shown) between the first reflecting electrode 144 and the second reflecting electrode 138, the active region 126 of LED 102 emits internally generated light. The internally generated light exits LED 102 through the top surface 122 of LED 102.

The first reflecting electrode 144 and the second reflecting electrode 138 of LED 102 may be fabricated from reflecting metals or partially transparent conducting oxides. For example, the first reflecting electrode 144 and the second reflecting electrode 138 may be formed from one or more metals or metal alloys containing, but not limited to, silver, aluminum, nickel, titanium, chromium, platinum, palladium, rhodium, rhenium, ruthenium and tungsten. In addition, the first reflecting electrode may also be fabricated from partially transparent conducting oxides such as indium tin oxide. If the first reflecting electrode is fabricated from a partially transparent conductive oxide, the electrode is only partially reflective.

In this specification, the first reflecting electrode 144 and the second reflecting electrode 138 are shown to be on opposite sides of LED 102. However, it is within the scope of this invention that the first reflecting electrode may be placed at other locations as long as it is in electrical contact with the first doped semiconductor layer 120. For example, as is well known by those skilled in the art, modifying the structure of LED 102 can allow both the first reflecting electrode and the second reflecting electrode to be located on the same side of LED 102.

LED 102 can be fabricated from GaN-based semiconductor materials containing gallium nitride (GaN), aluminum gallium nitride (AlGaN), indium gallium nitride (InGaN) and aluminum indium gallium nitride (AlInGaN). Other appropriate LED materials include, for example, aluminum nitride (AlN), boron nitride (BN), indium nitride (InN), aluminum gallium indium phosphide (AlGaInP), gallium arsenide (GaAs), indium gallium arsenide (InGaAs), indium gallium arsenide phosphide (InGaAsP), diamond or zinc oxide (ZnO), for example, but are not limited to such materials. Especially relevant LEDs for this invention are GaN-based LEDs that emit light in the ultraviolet, blue, cyan and green region of the optical spectrum and AlGaInP LEDs that emit light in the yellow and red regions of the optical spectrum. Also very relevant are LED material systems that exhibit low absorption throughout a substantial portion of their emission range. Examples of the latter materials include, but are not limited to, ZnO, BN, AlN and diamond, all of which have low absorption throughout the visible spectrum and have shorter wavelength emission spectra. The shorter wavelength emission can lead to improvements in wavelength conversion efficiency when used in conjunction with wavelength conversion materials such as phosphors.

As noted above, LED 102 may be fabricated from any suitable light-emitting semiconductor material such as the materials listed above. To better illustrate the embodiments of this invention, LED 102 is assumed for purposes of illustration to be a flip-chip, GaN-based LED having a top first reflecting electrode 144 and a bottom second reflecting electrode 138. It should be noted, however, that a flip-chip structure is not required.

To briefly summarize the important fabrication steps for this flip-chip, GaN-based, illustrative example, a first doped semiconductor layer is fabricated on a growth substrate such as sapphire. An active region is fabricated on the first doped semiconductor layer. A second doped semiconductor layer is fabricated on the active region. A second reflecting electrode is deposited onto the second doped semiconductor layer opposite the growth substrate, followed by the attachment of a sub-mount or base to the second reflecting electrode. The structure is inverted (flipped) and a liftoff process removes the growth substrate, exposing the surface of the first doped semiconductor layer that was originally attached to the growth substrate. Finally, a first reflecting electrode is deposited and patterned on the exposed surface of the first doped semiconductor layer opposite the second reflecting electrode.

The structure and fabrication of the illustrative example LED 100 shown in FIGS. 1A-1H will now be described in greater detail. See FIG. 1D for an expanded illustration of the structure of LED 102.

In this illustrative example, the first doped semiconductor layer 120 is an n-doped GaN layer, which is epitaxially deposited or otherwise conventionally fabricated on a sapphire growth substrate (not shown). The n-doped GaN semiconductor layer 120 has a first or upper surface 122 and a second or lower surface 124, opposite the first surface 122.

The active region 126 is a GaN-based multiple quantum well structure, which is epitaxially deposited or otherwise conventionally fabricated on the first doped semiconductor layer 120. The GaN-based multiple quantum well active region 126 has a first or upper surface 128, deposited or fabricated on the second surface 124 of the first doped semiconductor layer 120, and a second or lower surface 130, opposite the first surface 128. The active region 126 emits internally generated light in an emitting wavelength range when a voltage is applied across the first reflecting electrode 144 and the second reflecting electrode 138. The emitting wavelength range can include any optical wavelength. For an LED having a multiple quantum well active region 126, the emitting wavelength range typically has a full width of approximately 20 nm at the half-maximum points of the wavelength range. For visual and display applications, preferably the emitting wavelength range is between about 400 nm and about 700 nm.

The second doped semiconductor layer 132 is a p-doped GaN layer, which is epitaxially deposited or otherwise conventionally fabricated on the active region 126. The p-doped GaN semiconductor layer has a first or upper surface 134, epitaxially deposited or otherwise fabricated on the second surface 130 of the active region 126, and a second or lower surface 136, opposite the first surface 134.

The second reflecting electrode 138 of LED 102 is silver and is deposited or otherwise conventionally fabricated on the second doped semiconductor layer 132 by standard means such as evaporation or sputtering. The second reflecting electrode 138 has a first, upper and inner surface 140 fabricated on the second surface 136 of the second doped semiconductor layer, and a second or lower surface 142, opposite the first surface 140.

The upper surface 140 of the second reflecting electrode 138 is a reflecting surface for both internally generated light emitted by the active region 126 and externally incident light directed to LED 102.

After the second reflecting electrode 138 is formed on the second doped semiconductor layer 132, a sub-mount or base (such as base 110) is attached to the second reflecting electrode 138. A laser liftoff process utilizing an excimer laser removes the original sapphire substrate (not shown), exposing surface 122 of the first doped semiconductor layer 120.

The first reflecting electrode 144 is aluminum, which is deposited or otherwise conventionally fabricated on the first doped semiconductor layer 120. The first reflecting electrode 144 has a first, outer or upper surface 146, and a second, inner or lower surface 148 deposited or fabricated on the first surface 122 of the first doped semiconductor layer 120. The second surface 148 is opposite the first surface 146.

The inner surface 148 of the first reflecting electrode 144 is an inner reflecting surface for the first doped semiconductor layer 120 of LED 102. The outer surface 146 of the first reflecting electrode 144 is an outer reflecting surface for externally incident light directed to LED 102.

The first reflecting electrode 144 only partially covers the surface 122 of the first doped semiconductor layer 120. Portions of the surface 122 of the first doped semiconductor layer 120, not covered by the first reflecting electrode 144, are exposed and those exposed portions of the surface 122 of the first doped semiconductor layer 120 are an output or exit surface for the light emitted by the LED 102.

In side-emitting illumination system 100, some of the internally generated light emitted by the active region 126 of LED 102 through the output surface 122 is reflected by second reflector 106 and recycled back to LED 102 as externally incident light. A portion of the externally incident light is reflected by the first reflecting electrode 144 and the second reflecting electrode 138 of LED 102 and is directed through the output aperture 114 of the side-emitting illumination system. The output aperture 114 surrounds or encircles the LED 102 and the second reflector 106. Light is directed through the output aperture 114 from the LED 102 and the second reflector 106 in all lateral directions. The externally incident light reflected by the first reflecting electrode 144 and the second reflecting electrode 138 adds to the internally generated light emitted by the active region 126 of LED 102, thereby increasing the effective brightness of LED 102. The externally incident light reflected by the first reflecting electrode 144 and the second reflecting electrode 138 and directed through the output aperture 114 of the side-emitting illumination system adds to the internally generated light directly exiting the output aperture 114, thereby increasing the output brightness and efficiency of side-emitting illumination system 100.

The reflectivity of LED 102 to externally incident light depends on several factors. These factors include the reflectivity of the first reflecting electrode 144 and the reflectivity of the second reflecting electrode 138. Increasing the reflectivity of the first reflecting electrode 144 and/or the second reflecting electrode 138 will increase the reflectivity of LED 102 to externally incident light.

A common electrode material for the outer surface 146 of the first reflecting electrode in prior art light emitting devices is gold. Gold has very good electrical properties, but is a poor optical reflector for visible light in the range of 400 nm to 550 nm. For LEDs that emit light in the 400-550 nm range or thereabouts, it is advantageous to replace gold with a more reflective material. In order to improve the reflectivity of LED 102 to externally incident light, preferably the first reflecting electrode 144 has a reflectivity greater than 60 percent in the emitting wavelength range. More preferably, the first reflecting electrode 144 has a reflectivity greater than 80 percent in the emitting wavelength range. Suitable materials for the first reflecting electrode that have a reflectivity greater than 80 percent include aluminum and silver. In the illustrative example for LED 102, the first reflecting electrode is fabricated from aluminum.

The second reflecting electrode 138 covers a larger surface area than the first reflecting electrode 144. Consequently, the reflectivity of the second reflecting electrode is more critical than the reflectivity of the first metal electrode. In order to improve the reflectivity of LED 102 to externally incident light, preferably the reflectivity of the second reflecting electrode 138 is greater than 92 percent in the emitting wavelength range. More preferably the reflectivity of the second reflecting electrode is greater than 96 percent in the emitting wavelength range. Most preferably, the reflectivity of the second reflecting electrode is greater than 98 percent in the emitting wavelength range. A suitable material for the second reflecting electrode that has a reflectivity greater than 98 percent is silver. In the illustrative example for LED 102, the second reflecting electrode 138 is fabricated from silver.

Other factors that affect the overall reflectivity of LED 102 include the absorption coefficients of the LED structure, including the absorption coefficients of the first doped semiconductor layer 120, the active region 126 and the second doped semiconductor layer 132. The absorption coefficients of these layers are important since any externally incident light that is reflected by the second reflecting electrode 138 must pass through these layers. By lowering the absorption coefficients of the first doped semiconductor layer 120, the active region 126 and/or the second doped semiconductor layer 132, the reflectivity of LED 102 to externally incident light will increase.

Usually, the absorption coefficients of the first doped semiconductor layer 120, the active region 126 and the second doped semiconductor layer 132 in LED 102 are not the same. If the different semiconductor layers that make up LED 102 have different absorption coefficients, the absorption coefficient for LED 102 is defined in this specification as the thickness-weighted-average absorption coefficient for all the semiconductor layers. The weighting function is the fractional thickness of each semiconductor layer in LED 102. In order to improve the reflectivity of LED 102 to externally incident light, preferably the absorption coefficient (i.e. the thickness-weighted average absorption coefficient) of the semiconductor layers in LED 102 in the emitting wavelength range of the internally generated light is less than 50 $cm^{-1}$.

In prior art GaN-based LEDs, the absorption coefficient of the semiconductor layers in the emitting wavelength range is generally greater than 50 $cm^{-1}$. In order to minimize the absorption coefficient of a LED, the absorption coefficient for each semiconductor layer of the LED must be minimized. This can be accomplished by improving the deposition processes for the different semiconductor layers in order to reduce impurities or defects and to improve the crystalline structure of the layers. For example, hydride vapor phase epitaxy (HVPE) can be used to epitaxially grow the first doped semiconductor layer and the second doped semiconductor layer. HVPE does not have the carbon impurities that can be present in the metal-organic chemical vapor deposition (MOCVD) processes normally used in GaN LED fabrication. Alternatively, if MOCVD is used to deposit the semiconductor layers, a higher deposition temperature can be used to reduce carbon impurities and crystalline defects in the layers. Other alternate processes that lead to improved GaN crystal quality include molecular beam epitaxy (MBE) and high-pressure high-temperature (HPHT) crystal growth.

The overall reflectivity of LED 102 to externally incident light depends on the factors described above. In order to improve the efficiency and output brightness of side-emitting illumination system 100, preferably the reflectivity of LED 102 to externally incident light is greater than 40 percent. More preferably, the reflectivity of LED 102 to externally incident light is greater than 50 percent. Most preferably, the reflectivity of LED 102 to externally incident light is greater than 60 percent.

It is well known by those skilled in the art that LED 102 may include additional layers in order to adjust and improve the operation of the LED 102. For example, a current spreading layer may be inserted between the lower surface 148 of the first reflecting electrode 144 and the upper surface 122 of the first doped semiconductor layer 120. Such a current spreading layer will have the same conductivity type as the first doped semiconductor layer and will improve the uniformity of current injection across the entire active region. In addition, a current spreading layer may be inserted between the lower surface 136 of the second doped semiconductor layer and the upper surface 140 of the second reflecting electrode 138. The latter current spreading layer will have the same conductivity type as the second doped semiconductor layer. As another example, an electron blocking layer may inserted either between the lower surface 124 of the first doped semiconductor layer 120 and the upper surface 128 of the active region 126 or between the lower surface 130 of the active region 126 and the upper surface 134 of the second doped semiconductor layer 132. The electron blocking layer reduces the escape of electrons from the active region. If the current spreading layers or the electron blocking layers absorb part of the light passing through the layers, the reflectivity of LED 102 to externally incident light will be reduced. In order to minimize these effects, the absorption coefficients and thicknesses of any current spreading layers and/or electron blocking layers are preferably minimized.

Details will now be presented about the other elements of the side-emitting illumination system 100.

The first reflector 104 is a diffuse reflector, a specular reflector or a combination of a diffuse and specular reflector. Preferably the first reflector 104 is a specular reflector so that light exiting the output aperture 114 and subsequently reflected by the first reflector is not redirected in a vertical direction. The first reflector 104 surrounds or encircles LED 102. The first reflector 104 may touch LED 102 or there may be a gap 116 between first reflector 104 and LED 102 as shown in FIGS. 1A-1B. If first reflector 104 is electrically conductive, a gap 116 may be necessary in order to prevent electrical shorts between LED 102 and the first reflector 104. The first reflector 104 may have a planar or a non-planar surface. In FIGS. 1A-1I and in the other FIGURES in this specification, first reflector 104 is illustrated to have a planar surface.

The second reflector 106 is a diffuse reflector, a specular reflector or a combination of a diffuse and specular reflector. Preferably the second reflector 106 is a diffuse reflector so that light will exit through output aperture 114 with a minimum of consecutive reflections between the second reflector 106 and the first reflector 104 or between the second reflector 106 and the first reflecting electrode 144 and/or the second reflecting electrode 138 of LED 102. The second reflector 106 may be a planar surface as shown in FIGS. 1A-1H, where the separation distance 118 between the second reflector 106 and the first reflector 104 is constant across the second reflector 106. Alternatively, the second reflector 106 may be non-planar or curved, where the separation distance between the second reflector 106 and the first reflector 104 increases from the center of the second reflector to the edges 112 of the second reflector. Examples of non-planar shapes include pyramids, cones and convex surfaces.

The second reflector 106 has edges 112. The first reflector 104 and the edges 112 of the second reflector 106 form an output aperture 114 having a vertical width equal to the separation distance 118. As illustrated in FIGS. 1A-1C, the output aperture 114 preferably surrounds the LED 102 and provides an efficient output path in all lateral directions for light emitted by LED 102 and reflected by the second reflector 106.

The second reflector 106 is shown in plan view in FIGS. 1A to have a square shape. However, it is not necessary for the second reflector 106 to have a square shape. The second reflector 106 may have any shape, including a rectangle, a polygon, a circle, an ellipse or an irregular shape.

The area of the second reflector 106 shown in FIGS. 1A-1I is preferably larger than the area of the emitting surface 122 of LED 102. The larger area of the second reflector 106 prevents light emitted by LED 102 from exiting the output aperture 114 of the side-emitting illumination system in a vertical direction.

There are several types of diffuse reflecting materials that can be used for the first reflector 104 and the second reflector 106. Diffuse reflectors can be made that have very high reflectivity (for example, greater than 98%). Examples of diffuse reflectors include, but are not limited to, fluoropolymer materials such as Spectralon™ from Labsphere, Inc. and polytetrafluoroethylene film from manufacturers such as Fluorglas (sold under the trade name Furon™), W. L. Gore and Associates, Inc. (sold under the trade name DRP™), or E. I. du Pont de Nemours & Company (sold under the trade name of Teflon™), films of barium sulfate, porous polymer films containing tiny air channels such as polyethersulfone and polypropylene filter materials made by Pall Gelman Sciences, and polymer composites utilizing reflective filler materials such as, for example, titanium dioxide. A preferred diffuse reflecting material is DRP™ made by W. L. Gore and Associates, Inc. Note that the thickness of a diffuse reflector needed to achieve high reflectivity can be reduced if a specular reflector is used as a backing layer on the diffuse reflector.

Most specular reflective materials have reflectivity ranging from about 80% to about 98.5%. Examples of specular reflective materials that can be used for the first reflector 104 and the second reflector 106 include, but are not limited to, Silverlux™, a product of 3M Corporation, and other carrier films of plastic that have been coated with a thin metallic layer such as silver, aluminum or gold. The thickness of the metallic coating may range from about 0.05 micrometers to about 0.1 millimeter, depending on the materials used and the method of manufacturing the metal coating. Other examples of specular reflective films that have high reflectivity include photonic bandgap reflective materials, distributed Bragg reflectors (DBRs), omni-directional reflectors (ODRs) and Vikuiti™ ESR (Enhanced Specular Reflector) made by 3M Corporation. The ESR film, for example, has a reflectivity of greater than 98% across the visible light spectrum. Preferred specular reflectors are Silverlux™ and Vikuiti™ ESR materials made by 3M Corporation and various types of ODR films.

The supporting means for side-emitting illumination system 100 may be any structure that holds the LED 102, the first reflector 104 and the second reflector 106 in position where the first reflector 104 and the second reflector 106 are separated by separation distance 118. One example of a supporting means is base 110 and one or more posts 108 that hold and separate the first reflector 104 and the second reflector 106 as shown in FIG. 1B. Preferably, the posts 108 are reflective or transparent to the internally generated light of LED 102, but reflective or transparent posts are not required if the posts are small in area compared to the area of the output aperture 114. For ease in understanding the invention, the posts 108 are not shown in subsequent FIGS. 1C-1I.

Another type of supporting means is a planar transparent sheet to which the second reflector is attached. The planar transparent sheet is held separated from the first reflector by edge supports. Another type of supporting means is a semi-rigid or rigid transparent element that fills the space between the output surface of the light emitting diode and the second reflector. Another type of supporting means is a structural element that is attached to a waveguide and that holds the second reflector in position separated from the first reflector. Some examples of supporting means are illustrated in later FIGURES. These examples of supporting means are not intended to be exhaustive or to limit the scope of the invention to these examples.

FIGS. 1E-1I illustrate example light rays emitted by the active region 126 of LED 102.

Figure 1E:
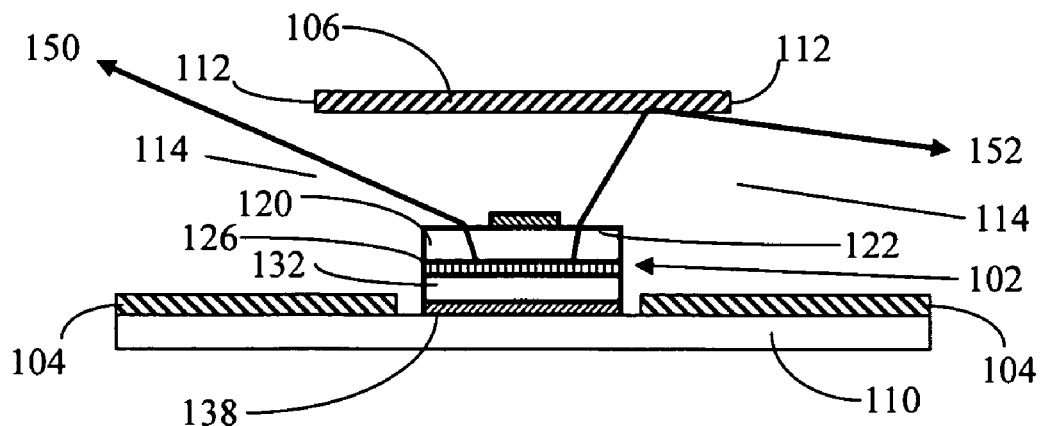

In FIG. 1E, example internally generated light ray 150 is emitted by the active region 126 and directed toward the surface 122 of LED 102. Surface 122 is both the first surface of the first doped semiconductor layer 120 and the output surface of LED 102. Internally generated light ray 150 is transmitted through output surface 122 and exits the side-emitting illumination system 100 through output aperture 114 without reflection.

Example internally generated light ray 152 is emitted by the active region 126 and directed toward the surface 122 of LED 102. Internally generated light ray 152 is transmitted through output surface 122 and is directed to second reflector 106. Internally generated light ray 152 is reflected by second reflector 106 and exits the side-emitting illumination system 100 through output aperture 114.

Figure 1F:
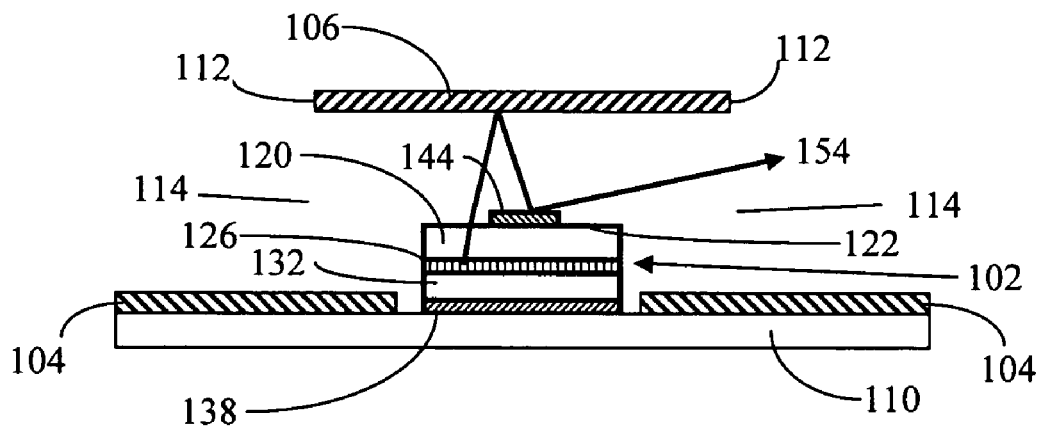

In FIG. 1F, light ray 154 is emitted by the active region 126 of LED 102 as internally generated light and is directed toward the surface 122 of LED 102. Light ray 154 is transmitted through surface 122 and is directed to second reflector 106. Light ray 154 is reflected by second reflector 106 and is recycled back to LED 102 as externally incident light directed toward the first reflecting electrode 144 of LED 102. Light ray 154 is reflected by the first reflecting electrode 144 of LED 102 and exits the side-emitting illumination system 100 through output aperture 114. The reflection of light ray 154 by the first reflecting electrode of LED 102 adds to the internally generated light (not shown in FIG. 1F) concurrently emitted by LED 102, thereby increasing the effective brightness of LED 102. The passage of light ray 154 through output aperture 114 adds to the internally generated light concurrently exiting output aperture 114, thereby increasing the efficiency and output brightness of side-emitting illumination system 100.

Figure 1G:
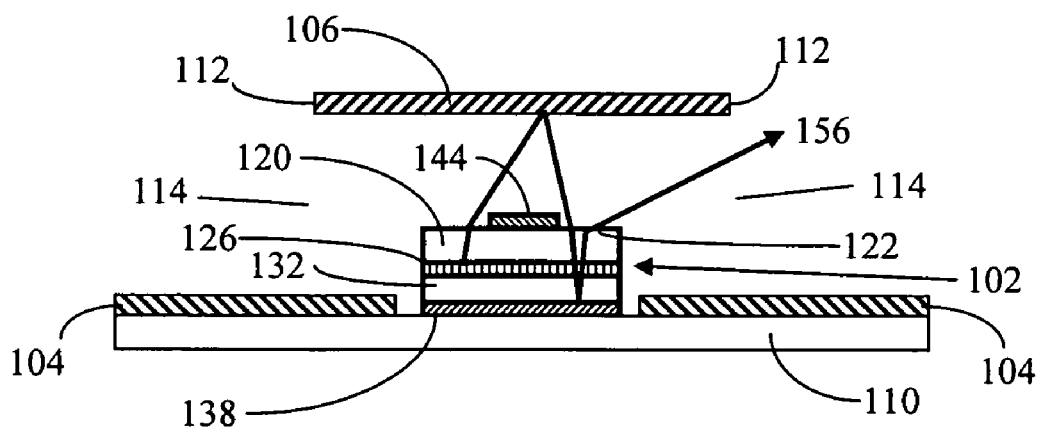

In FIG. 1G, light ray 156 is emitted by the active region 126 of LED 102 as internally generated light and is directed toward the surface 122 of LED 102. Light ray 156 is transmitted through surface 122 a first time and is directed to second reflector 106. Light ray 156 is reflected by second reflector 106 and is recycled back to LED 102 as externally incident light directed toward surface 122 of LED 102. Light ray 156 is transmitted through surface 122 a second time, is directed to second reflecting electrode 138, is reflected by second reflecting electrode 138 and is directed back to surface 122. Light ray 156 is transmitted through surface 122 a third time and exits the side-emitting illumination system 100 through output aperture 114. The reflection of light ray 156 from the second reflecting electrode 138 of LED 102 adds to the internally generated light (not shown in FIG. 1G) concurrently emitted by LED 102, thereby increasing the effective brightness of LED 102. The passage of light ray 156 through output aperture 114 adds to the internally generated light concurrently exiting output aperture 114, thereby increasing the efficiency and output brightness of side-emitting illumination system 100.

Figure 1H:
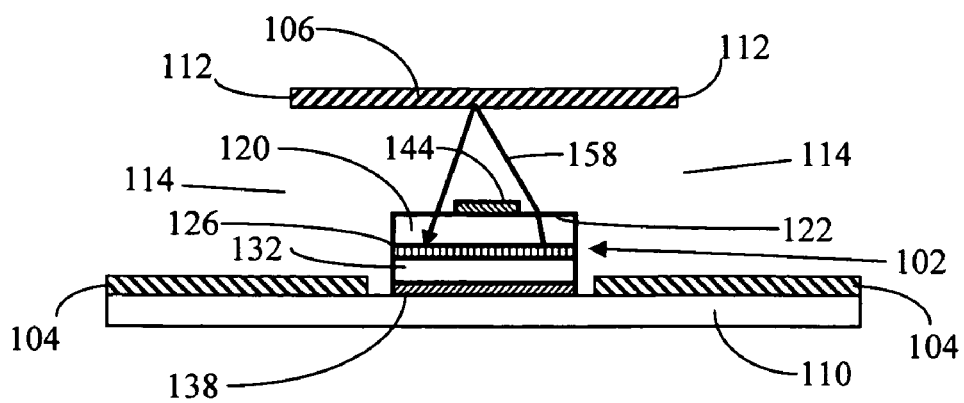

In FIG. 1H, light ray 158 is emitted by the active region 126 of LED 102 as internally generated light and is directed toward the surface 122 of LED 102. Light ray 158 is transmitted through surface 122 a first time and is directed to second reflector 106. Light ray 158 is reflected by second reflector 106 and is recycled back to LED 102 as externally incident light directed toward surface 122 of LED 102. Light ray 158 is transmitted through surface 122 a second time and is absorbed by one of the semiconductor layers of LED 102. LED 102 does not reflect all externally incident light directed to LED 102. Some externally incident light, such as light ray 158, is absorbed by LED 102.

Light ray 154 is reflected by first reflecting electrode 144 of LED 102. Light ray 156 is reflected by the second reflecting electrode 138 of LED 102. Light ray 158 is absorbed by one of the semiconductor layers of LED 102. Only a portion of the externally incident light directed to LED 102 is reflected by the first reflecting electrode 144 and the second reflecting electrode 138 of LED 102 and subsequently exits illumination system 100 through the output aperture 114. The remainder of the externally incident light directed to LED 102 is absorbed by LED 102.

Figure 1I:
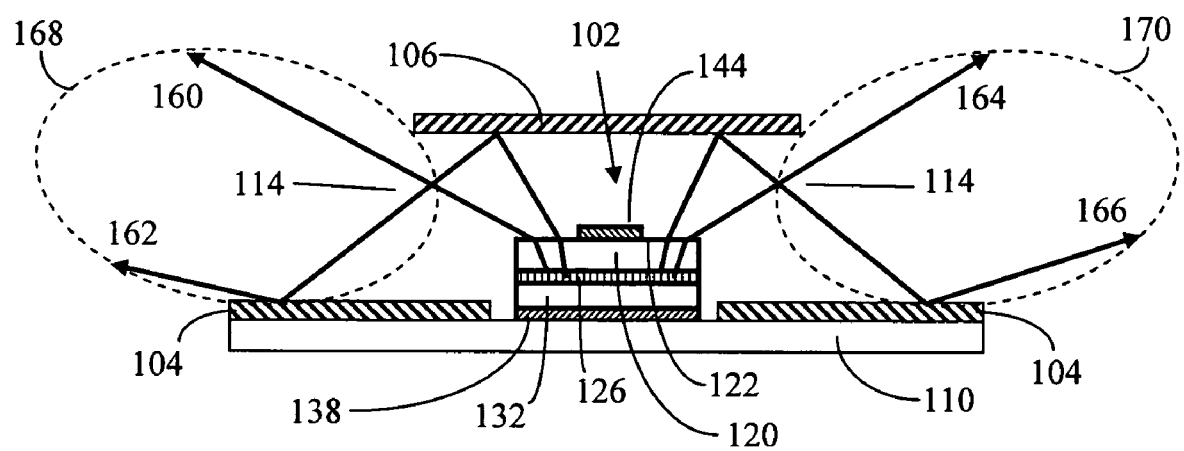

Internally generated light rays 160, 162, 164 and 166 in FIG. 1I schematically illustrate the light output distribution of light exiting the output aperture 114. The light exits to the sides of the side-emitting illumination system 100 as shown by dotted lines 168 and 170. Little or no light passes through the second reflector 106 in a direction normal to the output surface 122.

Internally generated light ray 160 is emitted by the active region 126 and is directed toward surface 122 of LED 102. Internally generated light ray 160 is transmitted through surface 122 and exits the side-emitting illumination system 100 through output aperture 114.

Internally generated light ray 162 is emitted by the active region 126 of LED 102 and is directed toward surface 122 of LED 102. Internally generated light ray 162 is transmitted through surface 122 and is directed to the second reflector 106. Internally generated light ray 162 is reflected by the second reflector 106, exits the side-emitting illumination system 100 through output aperture 114 and is directed to the first reflector 104. First reflector 104 reflects internally generated light ray 162.

Internally generated light ray 164 is emitted by the active region 126 and is directed toward surface 122 of LED 102. Internally generated light ray 164 is transmitted through surface 122 and exits the side-emitting illumination system 100 through output aperture 114.

Internally generated light ray 166 is emitted by the active region 126 of LED 102 and is directed toward surface 122 of LED 102. Internally generated light ray 166 is transmitted through surface 122 and is directed to the second reflector 106. Internally generated light ray 166 is reflected by the second reflector 106, exits the side-emitting illumination system 100 through output aperture 114 and is directed to the first reflector 104. First reflector 104 reflects internally generated light ray 166.

Figure 2A:
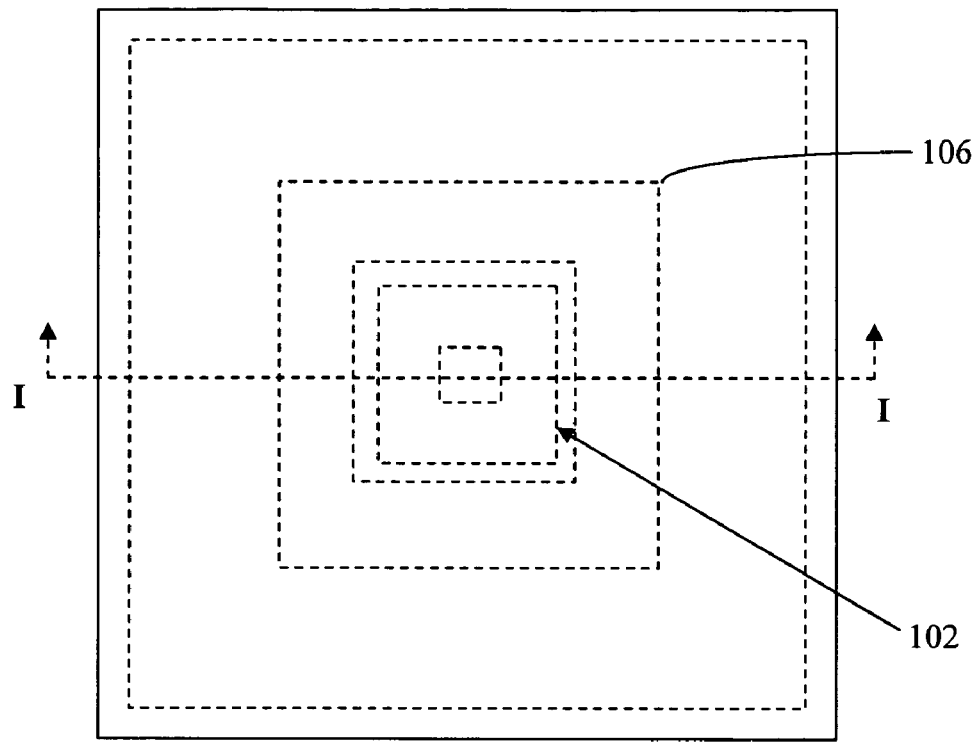
FIG. 2A is a top plan view of another embodiment of a side-emitting illumination system of this invention.
Figure 2B:
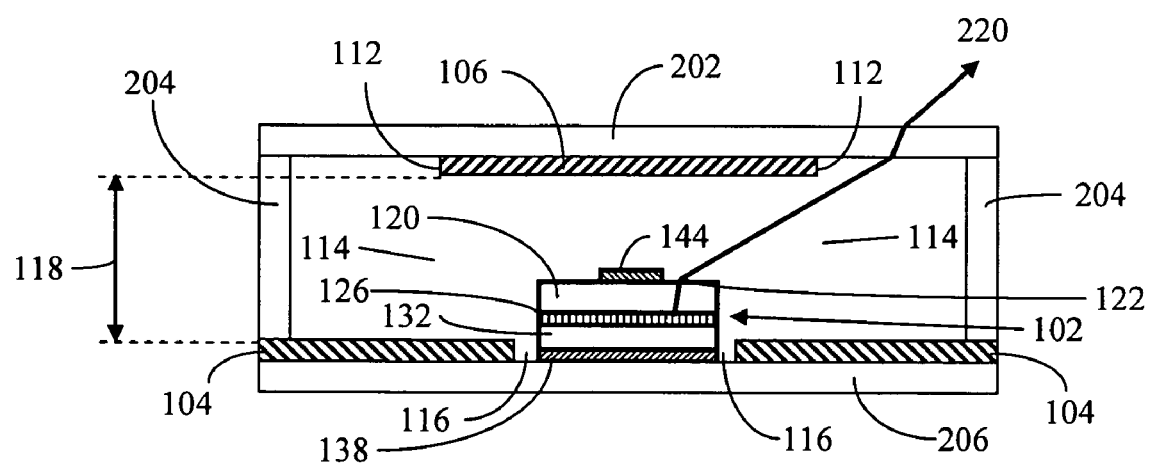
FIG. 2B is a cross-sectional side view along the I-I plane of the side-emitting illumination system illustrated in FIG. 2A.

Another embodiment of this invention is side-emitting illumination system 200, illustrated in plan view in FIG. 2A. A cross-sectional view along the I-I plane of the side-emitting illumination system 200 shown in FIG. 2A is illustrated in FIG. 2B.

Side-emitting illumination system 200 is comprised of LED 102, first reflector 104, an opposing second reflector 106 that has edges 112, output aperture 114 and supporting means that hold and separate the second reflector 106 from the first reflector 104. The supporting means include a planar transparent element 202, edge supports 204 and base 206. LED 102, first reflector 104 and second reflector 106 have been described previously. In this embodiment, second reflector 106 is a planar reflector and is separated from first reflector 104 by separation distance 118. The first reflector is attached to base 206. The first reflector 104 and the edges 112 of second reflector 106 form output aperture 114.

Second reflector 106 is attached to transparent element 202. Transparent element 202 provides support for second reflector 106 and does not block any portion of the output aperture 114. Transparent element 202 can be made from any light transmitting material. Example materials include, but are not limited to, polymers such as acrylic and polystyrene as well as inorganic glasses. In this example, transparent element 202 is planar, but planarity is not required.

Edge supports 204 hold and separate the planar transparent element 202 from first reflector 104 and base 206. Edge supports 204 are preferably transparent, but transparency is not required.

Example internally generated light ray 220 in FIG. 2B illustrates light exiting side-emitting illumination system 200. Internally generated light ray 220 is emitted by active region 126 of LED 102 and is directed to surface 122. Internally generated light ray 220 is transmitted through surface 122 and is directed to output aperture 114. Internally generated light ray 220 passes through output aperture 114 and subsequently exits side-emitting illumination system 202 through transparent element 202.

Figure 3:
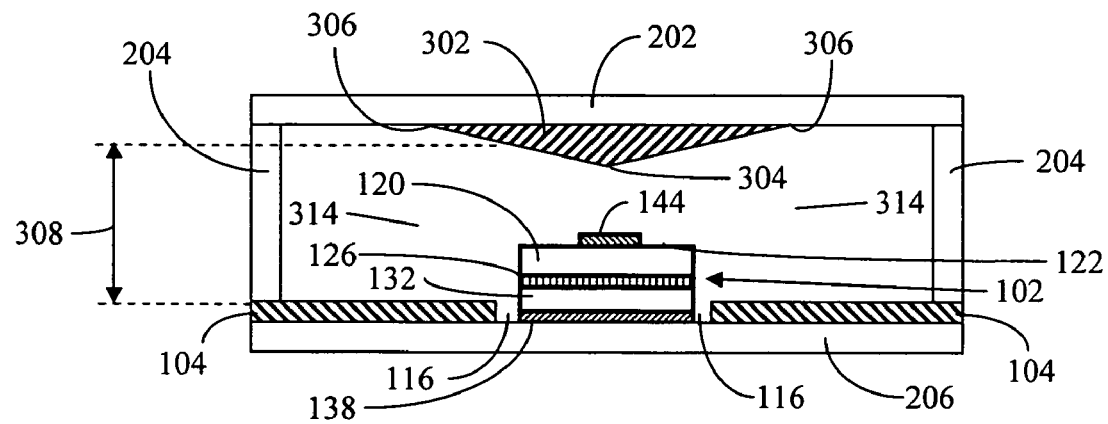
FIG. 3 is a cross-sectional side view of an embodiment of a side-emitting illumination system of this invention that includes a second reflector with a non-planar surface that is in the shape of an inverted peak.

Another embodiment of this invention is side-emitting illumination system 300 illustrated in cross-section in FIG. 3. Side-emitting illumination system 300 is comprised of LED 102, first reflector 104, an opposing second reflector 302 that has edges 306, output aperture 314 and supporting means that hold and separate the second reflector 302 from the first reflector 104. The supporting means include a planar transparent element 202, edge supports 204 and base 206.

FIG. 3 is similar to FIG. 2 except that the second reflector 302 in FIG. 3 is not planar. The second reflector 302 is in the shape of an inverted peak, where the peak is located at the center 304 of second reflector 302. As shown in FIG. 3, preferably the second reflector is symmetrical in shape and centered above the LED in order to redirect the light emitted by the LED through the output aperture 314. Example shapes for second reflector 302 include, but are not limited to, an inverted cone or an inverted pyramid. The separation distance 308 between the second reflector 302 and the first reflector 104 increases from the center 304 of the second reflector to the edges 306 of the second reflector. The non-planar surface can reduce the number of reflections between the first reflector 104 or the LED 102 and the second reflector 302 that a light ray will undergo before passing through the output aperture 314. Second reflector 302 is fabricated from the same materials as second reflector 106 described previously.

Figure 4:
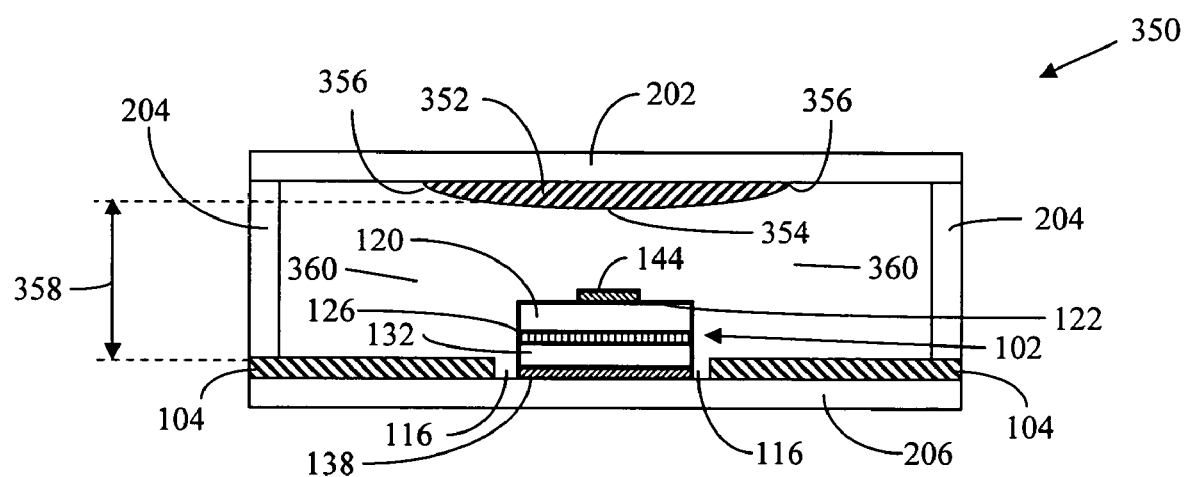
FIG. 4 is a cross-sectional side view of an embodiment of a side-emitting illumination system of this invention that includes a second reflector with a curved surface.

Another embodiment of this invention is side-emitting illumination system 350 illustrated in cross-section in FIG. 4. Side-emitting illumination system 350 is comprised of LED 102, first reflector 104, an opposing second reflector 352 that has edges 356, output aperture 360 and supporting means that hold and separate the second reflector 352 from the first reflector 104. The supporting means include a planar transparent element 202, edge supports 204 and base 206.

FIG. 4 is similar to FIG. 2 except that the second reflector 352 in FIG. 4 is not planar. The second reflector 352 is curved. As shown in FIG. 4, preferably the second reflector is symmetrical in shape and centered above the LED in order to redirect the emitted light through the output aperture 360. Example curved structures for second reflector 352 include, but are not limited to, a portion of a sphere or a portion of an ellipsoid. The separation distance 358 between the second reflector 352 and the first reflector 104 increases from the center 354 of the second reflector to the edges 356 of the second reflector. The non-planar surface can reduce the number of reflections between the first reflector 104 or the LED 102 and the second reflector 352 that a light ray will undergo before passing through the output aperture 360. Second reflector 352 is fabricated from the same materials as second reflector 106 described previously.

Figure 5A:
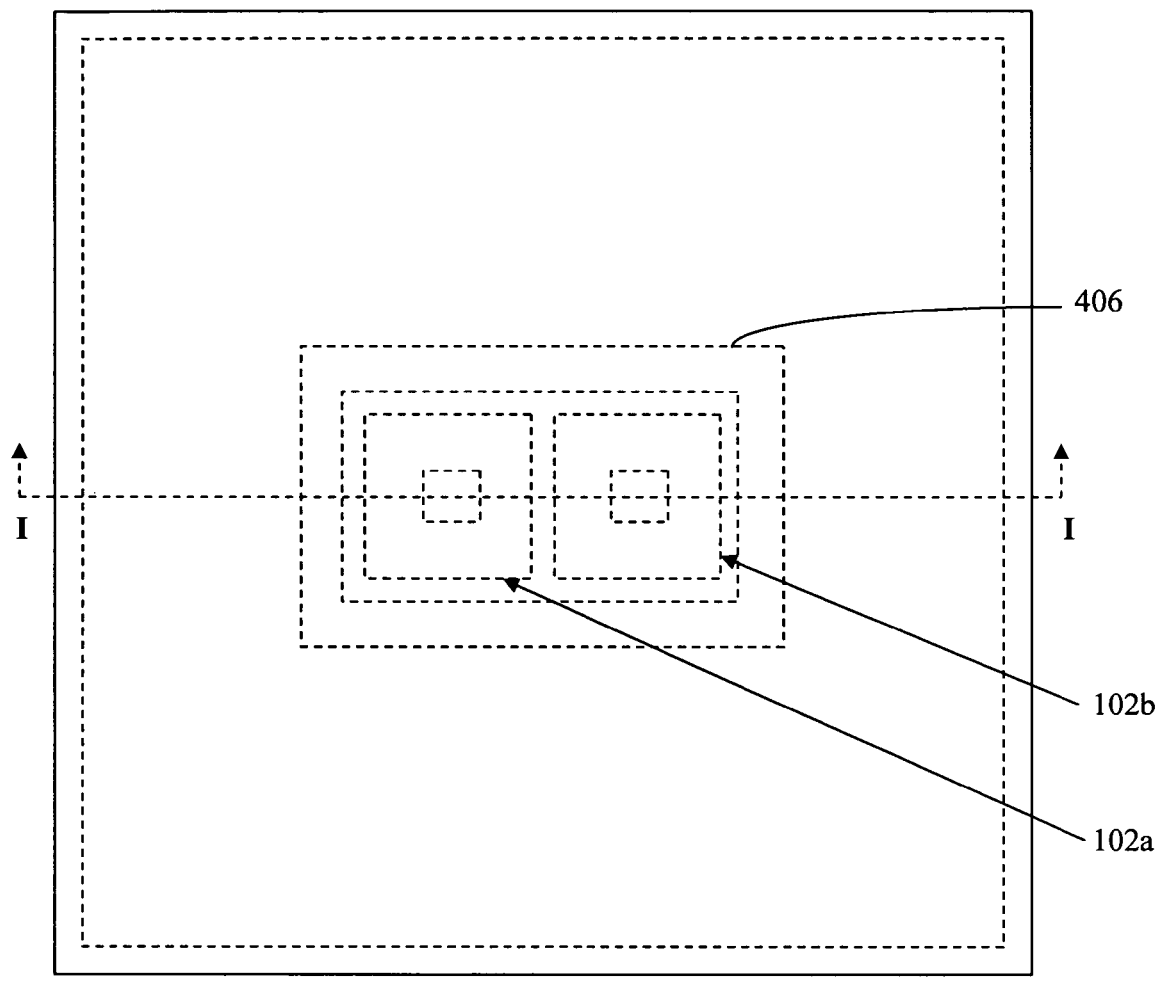
FIG. 5A is a top plan view of an embodiment of a side-emitting illumination system of this invention that includes two LEDs associated with a second reflector.
Figure 5B:
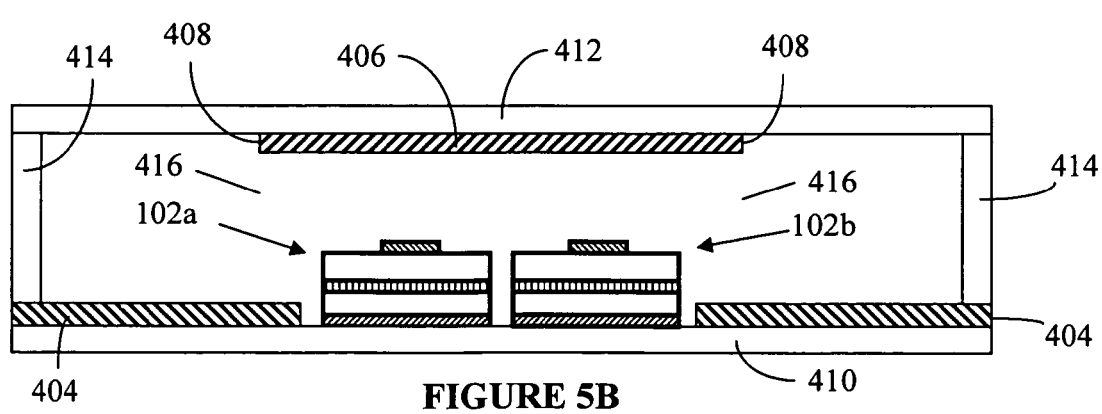
FIG. 5B is a cross-sectional side view along the I-I plane of the side-emitting illumination system illustrated in FIG. 5A.

Another embodiment of this invention is side-emitting illumination system 400 illustrated in plan view in FIG. 5A. A cross-sectional view along the I-I plane of the side-emitting illumination system 400 shown in FIG. 5A is illustrated in FIG. 5B.

Side-emitting illumination system 400 is comprised of LED 102a, LED 102b, first reflector 404, second reflector 406 having edges 408, output aperture 416 formed by the first reflector 404 and the edges 408 of second reflector 406 and supporting means that hold and separate the second reflector 406 from the first reflector 404. The supporting means include a planar transparent element 412, edge supports 414 and base 410. Light that exits output aperture 416 is transmitted by the planar transparent element 412. Edge supports 414 may either transmit or reflect light.

Side-emitting illumination system 400 is similar to side-emitting illumination system 200 shown in FIGS. 2A-2B except that side-emitting illumination system 400 has two LEDs, LED 102a and LED 102b, associated with a single second reflector 406. LED 102a and LED 102b have the same structure and properties as LED 102 described previously. The two LEDs may each emit the same color of internally generated light or the two LEDs may each emit a different color. If the two LEDs each emit a different color of light, the reflection of the two colors of light from the second reflector 406 will partially mix the two colors and improve the color uniformity of the light exiting output aperture 416. However, in the example illustrated in FIGS. 5A-5B, complete and uniform mixing will not occur. For example, if LED 102a emits red light and LED 102b emits an equal amount of blue light, the side-emitting illumination system 400 will emit predominantly red light from the side of the output aperture 416 nearest LED 102a and predominantly blue light from the side of the output aperture 416 nearest LED 102b. At points in the output aperture 416 that are equidistant from LED 102a and LED 102b, the percentage of red light emitted will equal the percentage of blue light emitted. In order to improve light mixing, LED 102a should be positioned close to LED 102b and the area of the second reflector 406 should be larger than the total output areas of LED 102a and LED 102b. Increasing the area of the second reflector 406 will increase light mixing. First reflector 404 is fabricated from the same materials as first reflector 104 described previously. Second reflector 406 is fabricated from the same materials as second reflector 106 described previously. The second reflector 406 is illustrated in FIG. 5A to have a rectangular shape, but a rectangular shape is not required. Other example shapes for second reflector 406 may include, but are not limited to, a square, a polygon, a circle or an ellipse.

Figure 6A:
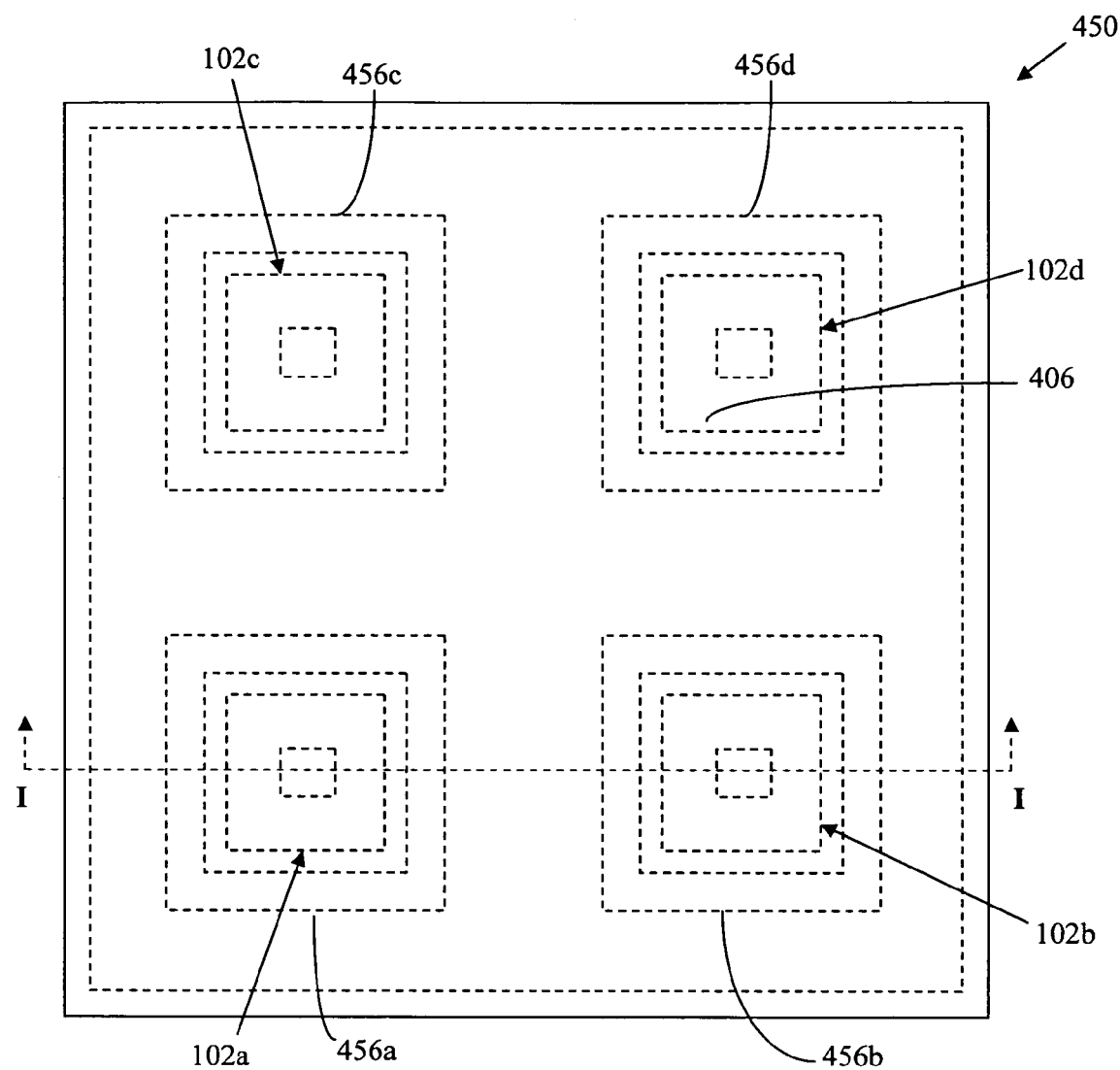
FIG. 6A is a top plan view of an embodiment of a side-emitting illumination system of this invention that includes four LEDs and four second reflectors. Each of the four LEDs is associated with a separate second reflector.
Figure 6B:
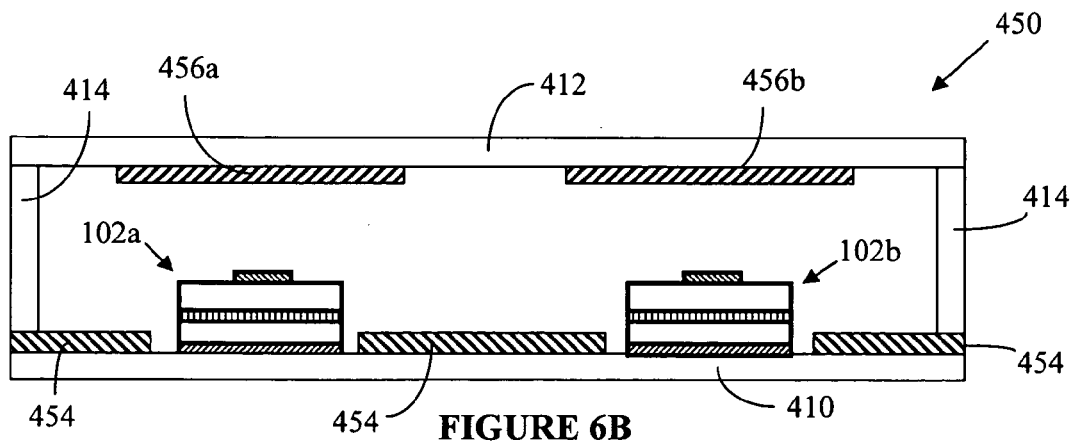
FIG. 6B is a cross-sectional side view along the I-I plane of the side-emitting illumination system illustrated in FIG. 6A.

Another embodiment of this invention is side-emitting illumination system 450 illustrated in plan view in FIG. 6A. A cross-sectional view along the I-I plane of the side-emitting illumination system 450 shown in FIG. 6A is illustrated in FIG. 6B.

Side-emitting illumination system 450 is comprised of LEDs 102a, 102b, 102c and 102d, first reflector 454, second reflectors 456a, 456b, 456c and 456d and supporting means that hold and separate the second reflectors 456a, 456b, 456c and 456d from the first reflector 454. The supporting means include a planar transparent element 412, edge supports 414 and base 410. The planar transparent element 412 transmits light emitted by the LEDs. Edge supports 414 may either transmit or reflect light. The second reflectors 456*a*, 456*b*, 456*c* and 456*d* are attached to planar transparent element 412. Each LED is associated with a separate second reflector. LED 102*a* is associated with second reflector 456*a*. LED 102*b* is associated with second reflector 456*b*. LED 102*c* is associated with second reflector 456*c*. LED 102*d* is associated with second reflector 456*d*.

Side-emitting illumination system 450 is similar to side-emitting illumination system 200 shown in FIGS. 2A-2B except that side-emitting illumination system 450 has four LEDs, LED 102*a*, LED 102*b*, LED 102*c* and LED 102*d*, associated, respectively, with four second reflectors 456*a*, 456*b*, 456*c* and 456*d*. LEDs 102*a*, 102*b*, 102*c* and 102*d* have the same structure and properties as LED 102 described previously in side-emitting illumination system 100. The four LEDs may each emit the same color of internally generated light or the four LEDs may emit more than one color of light. First reflector 454 is fabricated from the same materials as first reflector 104 described previously. Second reflectors 456*a*, 456*b*, 456*c* and 456*d* are fabricated from the same materials as second reflector 106 described previously. The second reflectors 456*a*, 456*b*, 456*c* and 456*d* are illustrated in FIG. 6A to each have a square shape, but a square shape is not required. Other example shapes for second reflectors 456*a*, 456*b*, 456*c* and 456*d* may include, but are not limited to, a rectangle, a polygon, a circle or an ellipse.

Figure 7A:
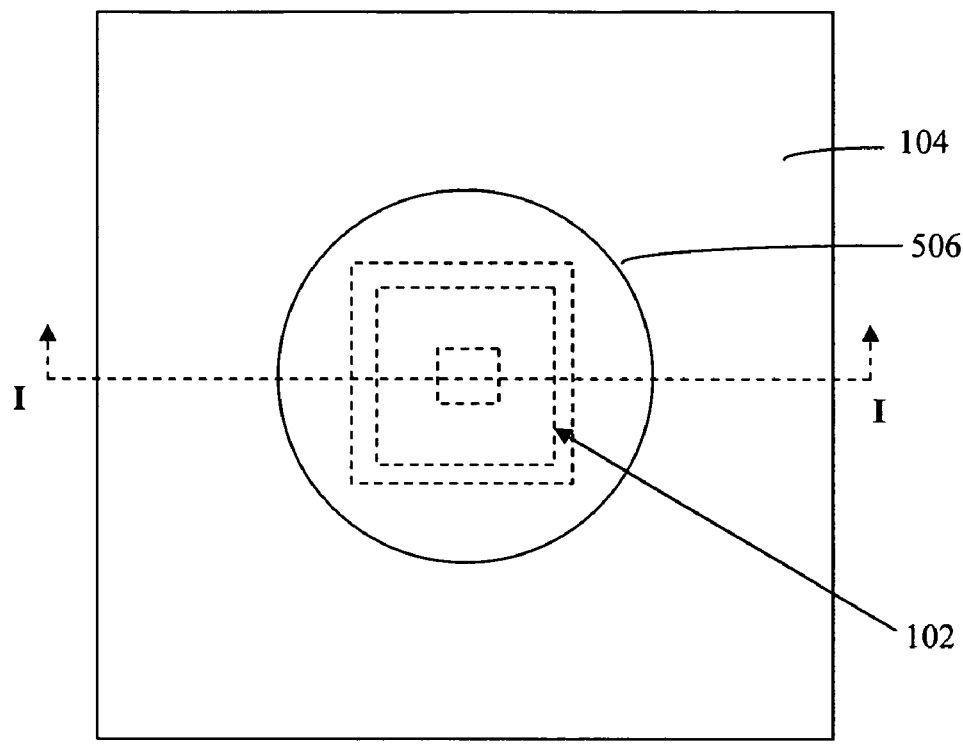
FIG. 7A is a top plan view of an embodiment of a side-emitting illumination system of this invention wherein the region between the first reflector and second reflector and the region surrounding the LED is filled with a transparent supporting element.
Figure 7B:
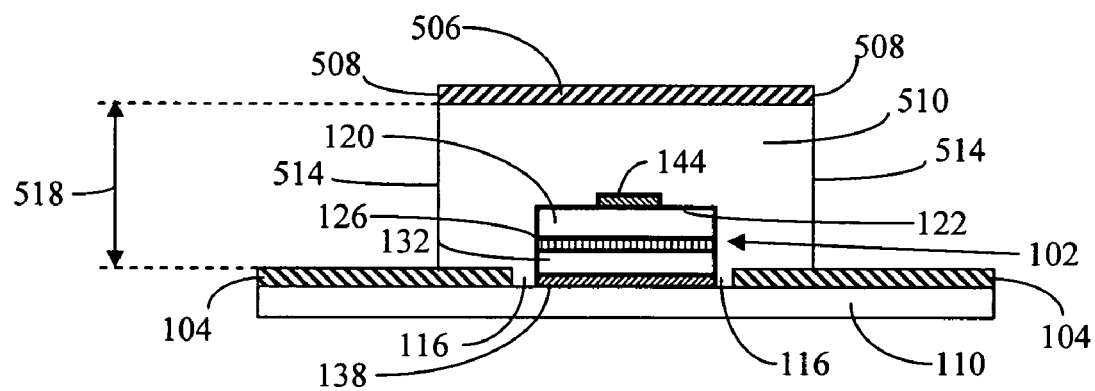
FIGS. 7B-7C are cross-sectional side views along the I-I plane of the side-emitting illumination system illustrated in FIG. 7A.
Figure 7C:
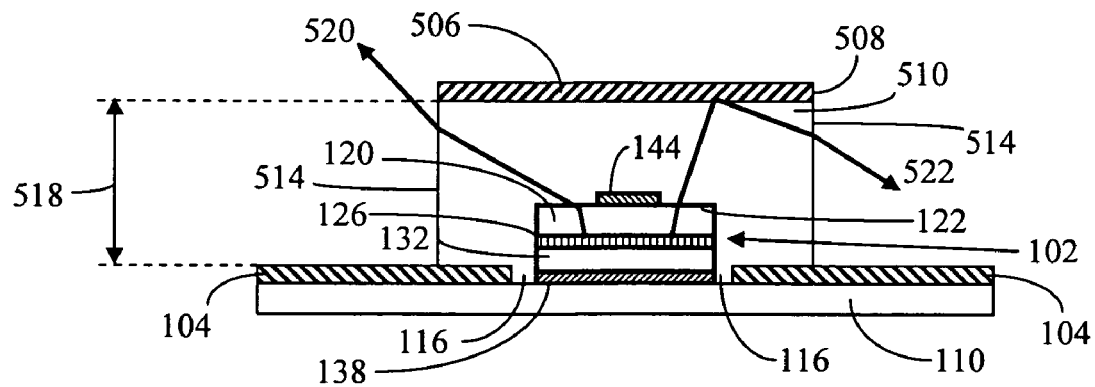

Another embodiment of this invention is side-emitting illumination system 500 illustrated in plan view in FIG. 7A. FIGS. 7B and 7C illustrate cross-sectional views along the I-I plane of the side-emitting illumination system 500 shown in FIG. 7A.

Side-emitting illumination system 500 is comprised of LED 102, first reflector 104, second reflector 506 having edges 508 and supporting means that hold and separate the second reflector 506 from the first reflector 104. The supporting means includes a solid transparent element 510 and base 110.

The solid transparent element 510 fills the space between the first reflector 102 and the second reflector 506 and surrounds LED 102. The edges 514 of the solid transparent element 510 are also the output aperture for side-emitting illumination system 500. Solid transparent element 510 may be fabricated from any solid, light-transmitting material. Suitable materials include, but are not limited to, plastics such as silicones, acrylic and polystyrene and inorganic glasses such as silica.

LED 102 and first reflector 104 have been described previously. Second reflector 506 is fabricated from the same materials as second reflector 106 described previously. The second reflector 506 is illustrated in FIG. 7A to have a circular shape, but a circular shape is not required. Other example shapes for second reflector 506 may include, but are not limited to, a square, a rectangle, a polygon or an ellipse.

Example light rays 520 and 522 in FIG. 7C illustrate the operation of side-emitting illumination system 500. Internally generated light ray 520 is emitted by active region 126 of LED 102 and is directed to output surface 122. Internally generated light ray 520 is transmitted through surface 122 of LED 102, through the solid transparent element 510 and is directed to surface 514, which is also the output aperture of side-emitting illumination system 500. Internally generated light ray 520 is transmitted through surface 514 and exits side-emitting illumination system 500.

Internally generated light ray 522 is emitted by active region 126 of LED 102 and is directed to output surface 122. Internally generated light ray 522 is transmitted through surface 122 of LED 102, through the solid transparent element 510 and is directed to second reflector 506. Internally generated light ray 522 is reflected by second reflector 506, is transmitted though the solid transparent element 510 and is directed to surface 514, which is also the output aperture of side-emitting illumination system 500. Internally generated light ray 522 is transmitted through surface 514 and exits side-emitting illumination system 500.

Figure 8A:
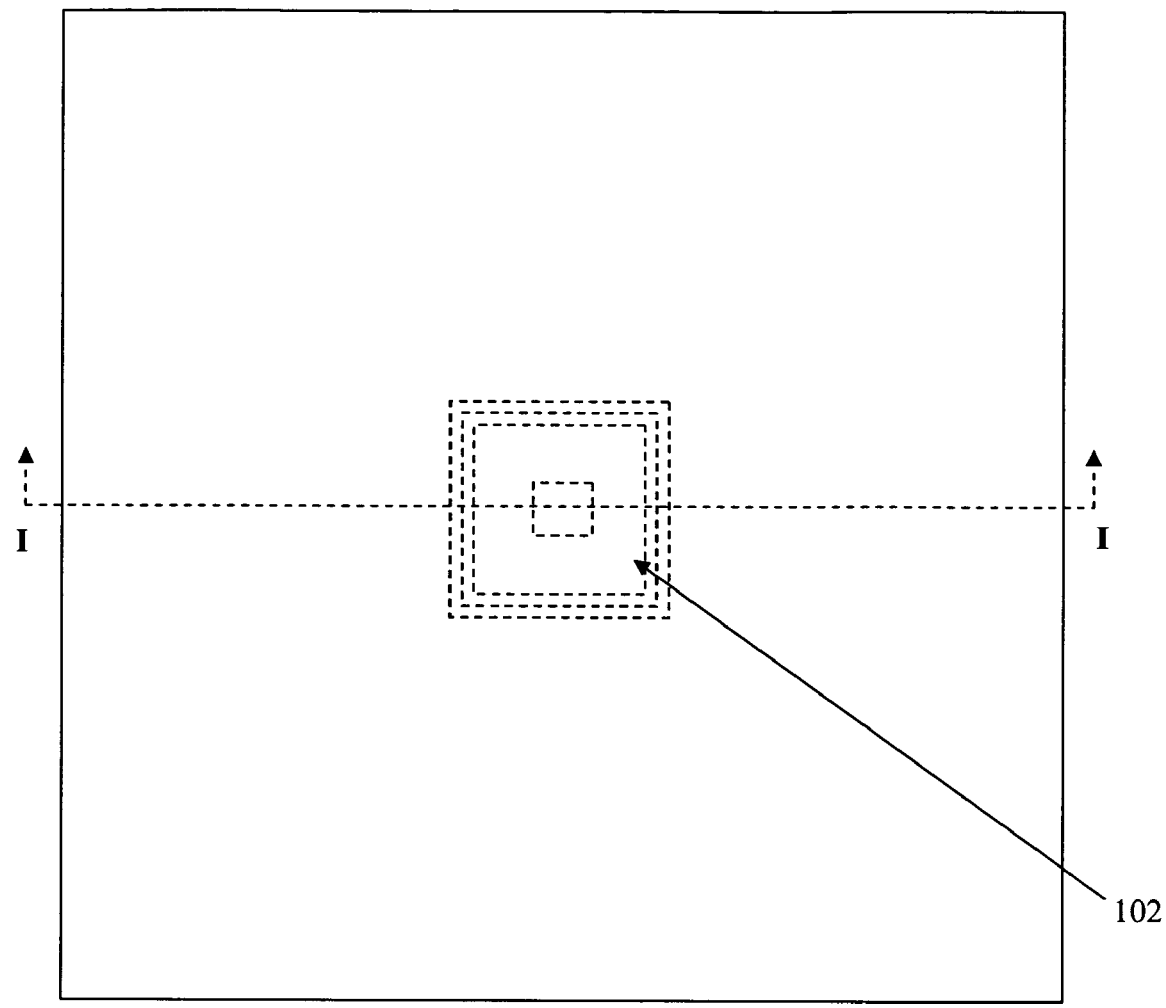
FIG. 8A is a top plan view of an embodiment of a side-emitting illumination system of this invention that includes a waveguide.
Figure 8B:
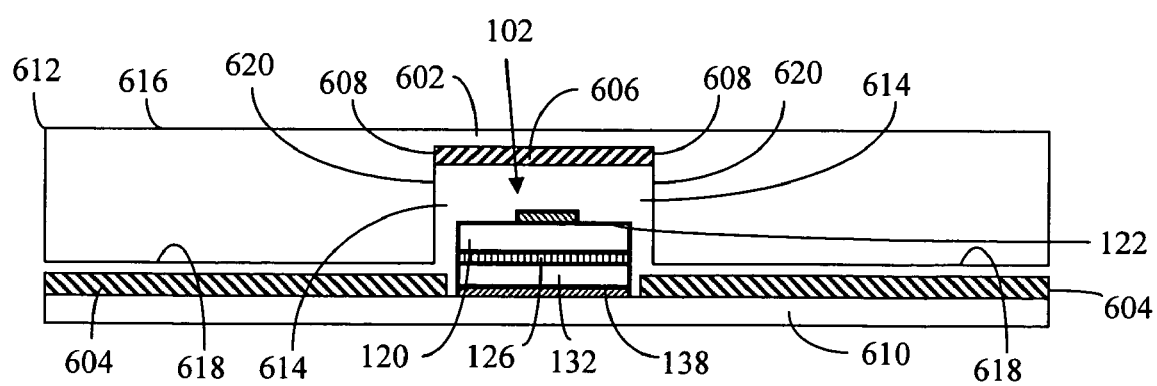
FIG. 8B is a cross-sectional side view along the I-I plane of the side-emitting illumination system illustrated in FIG. 8A.

Another embodiment of this invention is side-emitting illumination system 600 illustrated in plan view in FIG. 8A. FIGS. 8B-8E illustrate cross-sectional views along the I-I plane of the side-emitting illumination system 600 shown in FIG. 8A. Illumination system 600 includes a waveguide 612.

Side-emitting illumination system 600 is comprised of LED 102, first reflector 604, an opposing second reflector 606 that has edges 608, a waveguide 612, output aperture 614 and supporting means that hold and separate the second reflector 606 from the first reflector 604. The output aperture 614 is the air gap formed by the first reflector 604 and the edges 608 of second reflector 606. The supporting means include a planar element 602 that is attached to waveguide 612 and a base 610.

The waveguide 612 has a top surface 616, bottom surface 618 and input surfaces 620. The input surfaces 620 of waveguide 612 substantially span the output aperture 614. The waveguide can be fabricated from any solid material that is transparent to the internally generated light emitted by the active region 126 of LED 102. The waveguide transports light by total internal reflection. Possible materials for waveguide 612 include, but are not limited to, inorganic glasses such as silicon dioxide and plastics such as silicones, polymethylmethacrylate, fluoroacrylates, polystyrene and polycarbonate.

LED 102 has been described previously. The first reflector 604 is attached to base 610. The second reflector 606 is attached to planar element 602. The first reflector 604 and second reflector 606 have the same characteristics and properties as, respectively, the first reflector 104 and second reflector 106 that have been described previously. In this embodiment, second reflector 606 is a planar reflector, but planarity is not required. The second reflector 606 may also have a curved surface or a surface with the shape of an inverted pyramid or an inverted cone. The first reflector 604 and the edges 608 of the second reflector 606 form output aperture 614.

Figure 8C:
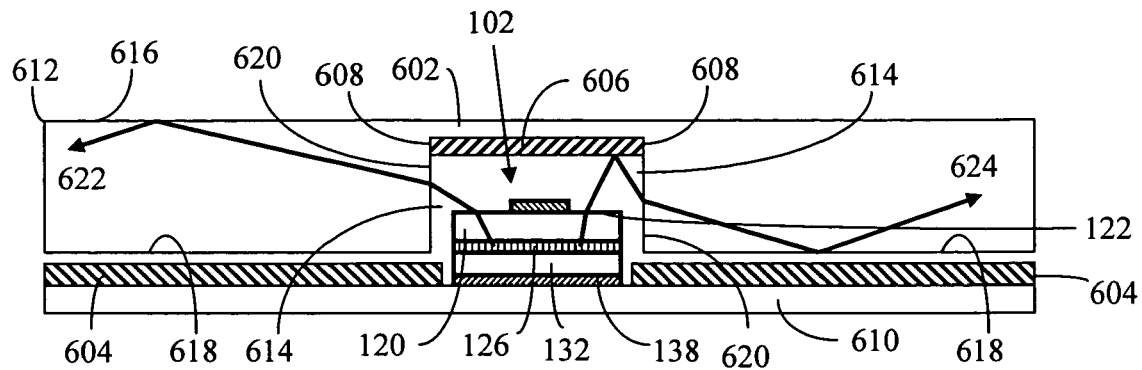
FIGS. 8C-8E illustrate example light rays emitted by the LED that are directed into the waveguide.
Figure 8D:
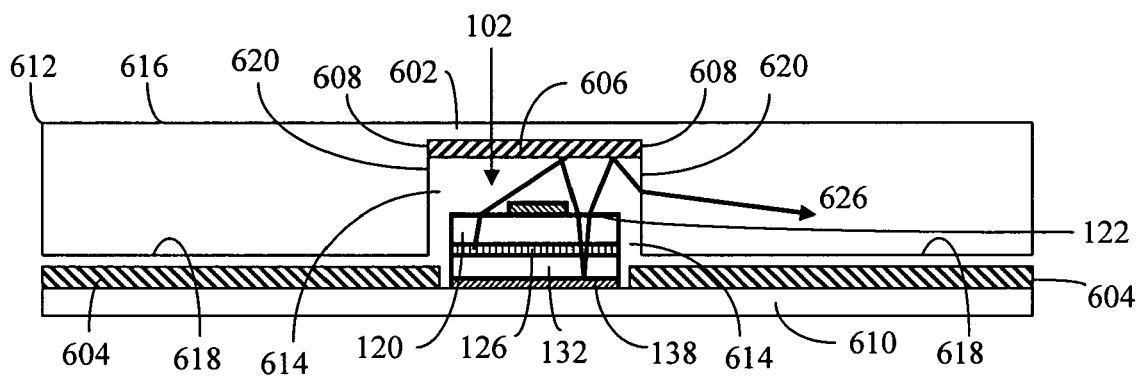
Figure 8E:
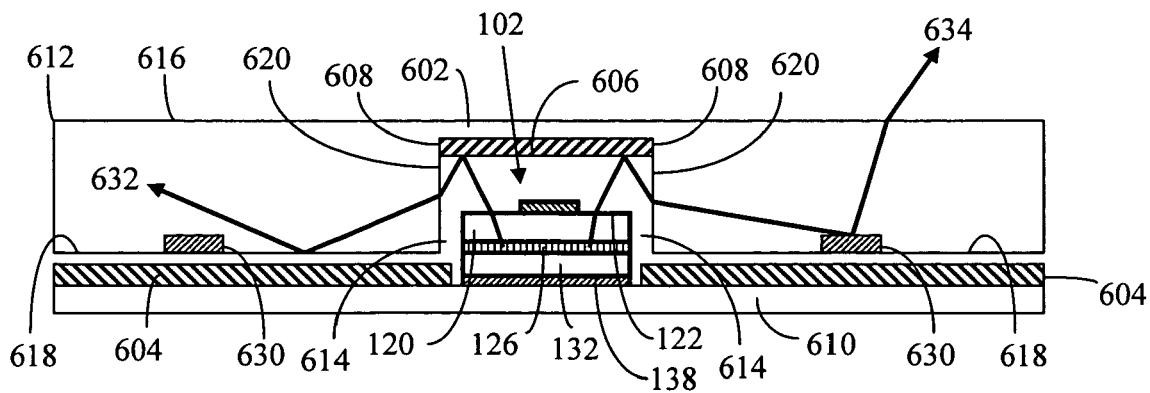

FIGS. 8C-8E illustrate example light rays emitted by LED 102.

Internally generated light ray 622 in FIG. 8C is emitted by active region 126 of LED 102 and is directed to output surface 122. Internally generated light ray 622 is transmitted through surface 122 and is directed through output aperture 614 and to input surface 620 of waveguide 612. Internally generated light ray 622 is transmitted through input surface 620, through the waveguide 612 and directed to top surface 616 of waveguide 612. Internally generated light ray 622 undergoes total internal reflection at top surface 616 and is transmitted further through waveguide 612.

Internally generated light ray 624 in FIG. 8C is emitted by active region 126 of LED 102 and is directed to output surface 122. Internally generated light ray 624 is transmitted through surface 122 and is directed to second reflector 606. Internally generated light ray 624 is reflected by second reflector 606 and is directed through output aperture 614 to input surface 620 of waveguide 612. Internally generated light ray 624 is transmitted through input surface 620, through the waveguide 612 and directed to bottom surface 618 of waveguide 612. Internally generated light ray 624 undergoes total internal reflection at bottom surface 618 and is transmitted further through waveguide 612.

Light ray 626 in FIG. 8D is emitted by active region 126 of LED 102 as internally generated light and is directed to output surface 122. Light ray 626 is transmitted through surface 122 and is directed to second reflector 606. Light ray 626 is reflected a first time by second reflector 606 and is directed (recycled) back to surface 122 of LED 102 as externally incident light. Light ray 626 is transmitted through surface 122 a second time and is directed to second reflecting electrode 138 of LED 102. Light ray 626 is reflected by second reflecting electrode 138 and is directed to surface 122. Light ray 626 is transmitted through surface 122 a third time and is directed to second reflector 606 a second time. Light ray 626 is reflected by second reflector 606 a second time and is directed through output aperture 614 to input surface 620 of waveguide 612. Internally generated light ray 622 is transmitted through input surface 620 and directed through waveguide 612.

Side-emitting illumination system 600 in FIG. 8E further includes light extracting elements 630 on the bottom surface 618 of waveguide 612. The side-emitting illumination system 600 directs light to the sides of LED 102, through the output aperture 614 located around the sides of LED 102 and through the input surface 620 of waveguide 612. Once the light is inside the waveguide, light extracting elements 630 within the waveguide structure can redirect the light approximately perpendicular to the plane of the waveguide. Light extracting elements 630 can scatter or reflect light so that a portion of the scattered light will no longer undergo total internal reflection at the top surface 616 of waveguide 612. Light can then exit the top surface 616 of the waveguide. Examples of light extracting elements 630 include, but are not limited to, grooves, roughened areas of the surface 618, white-painted spots, polarization-dependent elements or subwavelength features that can reflect or scatter light. Side-emitting illumination systems of this type that include elements to redirect light through the top surface of the illumination system are suitable as backlights for LCD panels.

Example internally generated light ray 632 in FIG. 8E illustrates a light ray that does not hit any extraction elements 630. Internally generated light ray 632 is emitted by active region 126 of LED 102 and is directed to output surface 122. Internally generated light ray 632 is transmitted through surface 122 and is directed to second reflector 606. Internally generated light ray 632 is reflected by second reflector 606 and is directed through output aperture 614 to input surface 620 of waveguide 612. Internally generated light ray 632 is transmitted through input surface 620, through the waveguide 612 and directed to bottom surface 618 of waveguide 612. Internally generated light ray 632 undergoes total internal reflection at bottom surface 618 and is transmitted further through waveguide 612.

Example internally generated light ray 634 in FIG. 8E illustrates a light ray that is extracted from waveguide 612 by extraction element 630. Internally generated light ray 634 is emitted by active region 126 of LED 102 and is directed to output surface 122. Internally generated light ray 634 is transmitted through surface 122 and is directed to second reflector 606. Internally generated light ray 634 is reflected by second reflector 606 and is directed through output aperture 614 to input surface 620 of waveguide 612. Internally generated light ray 634 is transmitted through input surface 620, through the waveguide 612 and directed to extraction element 630 on the bottom surface 618 of waveguide 612. Internally generated light ray 634 is reflected and scattered by extraction element 630 and is directed through the waveguide 612 to top surface 616 of waveguide 612 at less than the critical angle for total internal reflection. Internally generated light ray 634 is transmitted through top surface 616 of waveguide 612 and exits side-emitting illumination system 600.

Figure 9A:
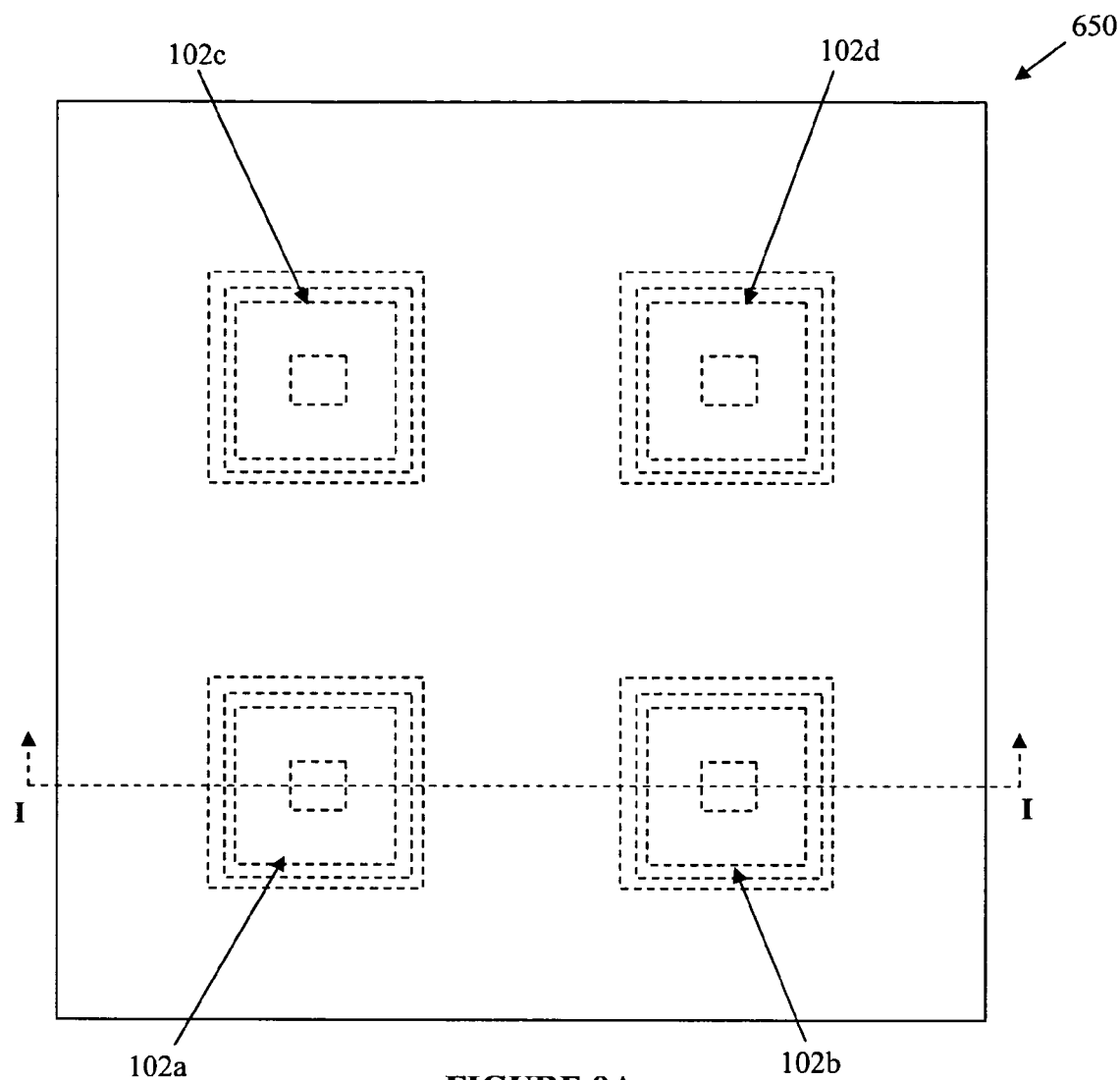
FIG. 9A is a top plan view of an embodiment of a side-emitting illumination system of this invention that includes a waveguide, four LEDs and four second reflectors.
Figure 9B:
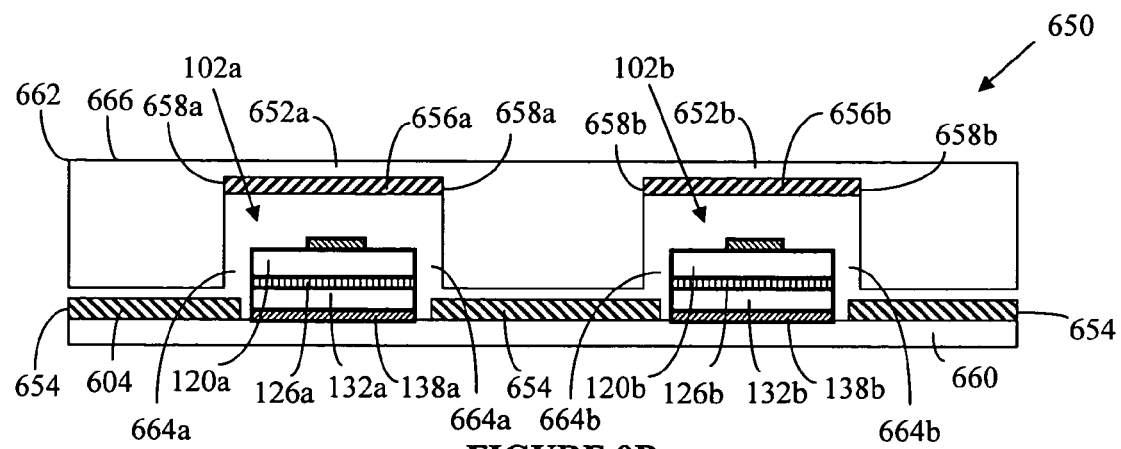
FIG. 9B is a cross-sectional side view along the I-I plane of the side-emitting illumination system illustrated in FIG. 9A.

Another embodiment of this invention is side-emitting illumination system 650 illustrated in plan view in FIG. 9A. FIG. 9B illustrates a cross-sectional view along the I-I plane of the side-emitting illumination system 650 shown in FIG. 9A. Side-emitting illumination system 650 includes a waveguide 662. Side-emitting illumination system 650 in FIGS. 9A-9B is similar to illumination system 600 illustrated in FIGS. 8A-8E except that side-emitting illumination system 650 includes four LEDs. Each LED is associated with a separate second reflector. The use of four LEDs in side-emitting illumination system 650 is an illustrative example. It is within the scope of this invention that more or less than four LEDs may be used. The four LEDs in side-emitting illumination system 650 are shown to be evenly spaced, but equal spacing is not a requirement of this invention.

Side-emitting illumination system 650 is comprised of LEDs 102a, 102b, 102c and 102d, first reflector 654, second reflectors 656a, 656b, 656c and 656d, waveguide 662, output apertures 664a, 664b, 664c and 664d, and supporting means that hold and separate the second reflectors 656a, 656b, 656c and 656d from the first reflector 654. The supporting means include planar elements 652a, 652b, 652c and 652d that are attached to waveguide 662. The supporting means also include a base 660. The first reflector 654 is attached to base 660. The second reflector 656a is attached to planar element 652a. The second reflector 656b is attached to planar element 652b. The second reflector 656c is attached to planar element 652c. The second reflector 656d is attached to planar element 652d.

Each LED is associated with a separate second reflector. LED 102a is associated with second reflector 656a. LED 102b is associated with second reflector 656b. LED 102c is associated with second reflector 656c. LED 102d is associated with second reflector 656d. LEDs 102a, 102b, 102c and 102d have the same structure and properties as LED 102 described previously in side-emitting illumination system 100. The four LEDs may each emit the same color of internally generated light or the four LEDs may emit more than one color of light. If the LEDs emit more than one color of light, reflections of the light of multiple colors inside waveguide 662 will result in mixing of the colors. Color mixing is important if side-emitting illumination system 650, optionally including additional light extracting elements as shown FIG. 8E for side-emitting illumination system 600, is utilized as part of a backlight for an LCD panel.

First reflector 654 is fabricated from the same materials as first reflector 104 described previously. Second reflectors 656a, 656b, 656c and 656d are fabricated from the same materials as second reflector 106 described previously. The second reflectors 656a, 656b, 656c and 656d are illustrated in FIG. 9A to each have a square shape, but a square shape is not required. Other example shapes for second reflectors 656a, 656b, 656c and 656d may include, but are not limited to, a rectangle, a polygon, a circle or an ellipse.

Waveguide 662 has the same properties as waveguide 612 described previously. The waveguide 662 is fabricated from transparent solid materials such as the materials listed for waveguide 612.

Figure 10A:
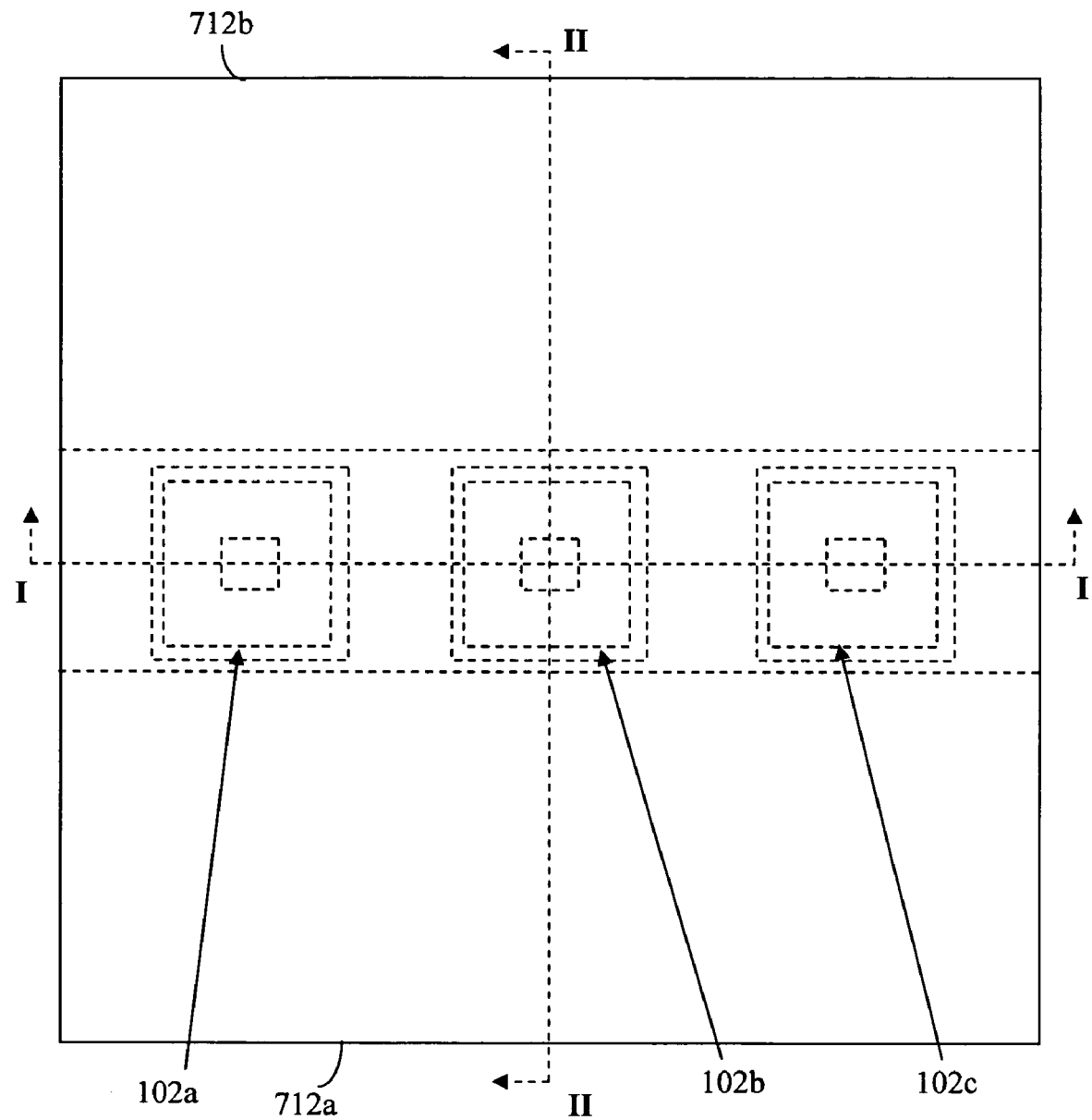
FIG. 10A is a top plan view of an embodiment of a side-emitting illumination system of this invention that includes two waveguides, three LEDs and a single second reflector.
Figure 10B:
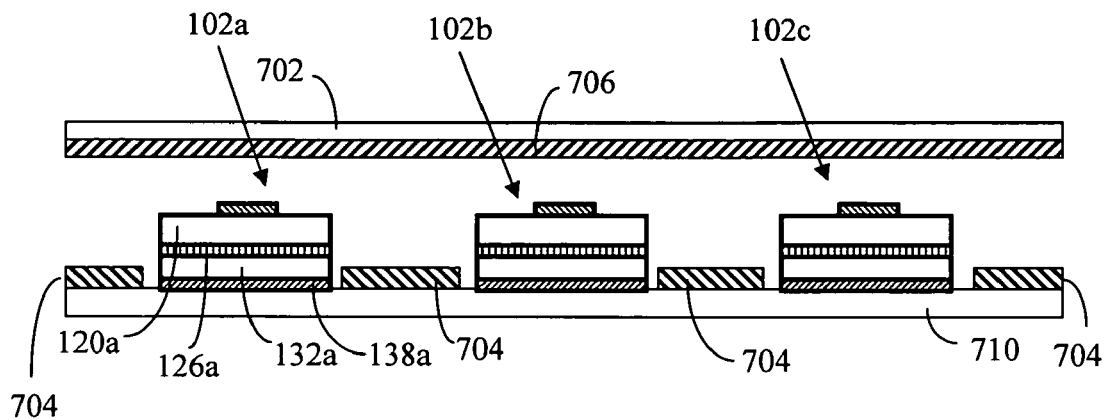
FIG. 10B is a cross-sectional side view along the I-I plane of the side-emitting illumination system illustrated in FIG. 10A.
Figure 10C:
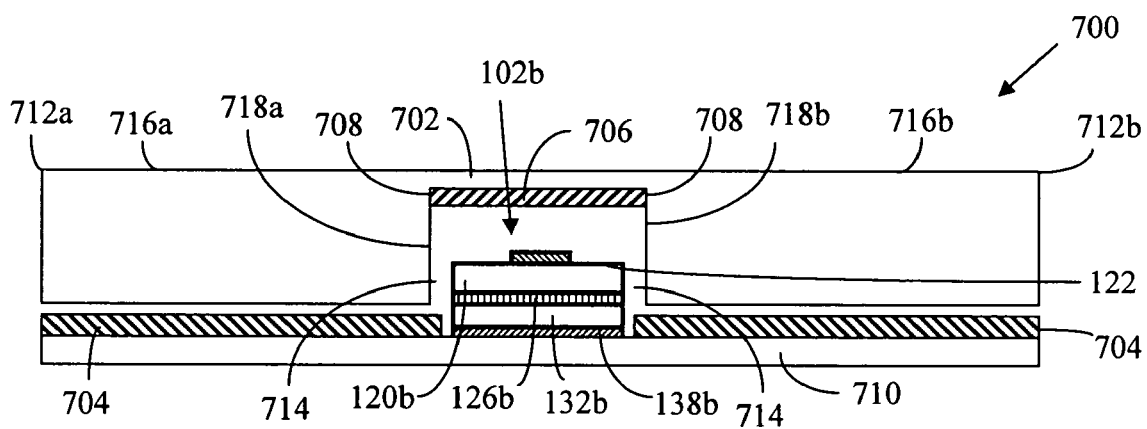
FIG. 10C is a cross-sectional side view along the II-II plane of the side-emitting illumination system illustrated in FIG. 10A.

Another embodiment of this invention is side-emitting illumination system 700 illustrated in plan view in FIG. 10A. FIG. 10B illustrates a cross-sectional view along the I-I plane of the side-emitting illumination system 700 shown in FIG. 10A. FIG. 10C illustrates a cross-sectional view along the II-II plane of the side-emitting illumination system 700 shown in FIG. 10A. Side-emitting illumination system 700 in FIGS. 10A-10C is similar to illumination system 600 illustrated in FIGS. 8A-8E except that side-emitting illumination system 700 includes three LEDs, 102a, 102b and 102c, and two waveguides, 712a and 712b. The three LEDs are associated with only a single second reflector 706.

Side-emitting illumination system 700 is comprised of LEDs 102a, 102b and 102c, first reflector 704, a single second reflector 706, waveguides 712a and 712b, output aperture 714 and supporting means that hold and separate the second reflector 706 from the first reflector 704. The output aperture 714 is the air gap formed by the first reflector 704 and the edges 708 of second reflector 706. The supporting means include a planar element 702 that is attached to and joins waveguides 712a and 712b. The supporting means also includes a base 710. The first reflector 704 is attached to base 710. The second reflector 706 is attached to planar element 702.

The three LEDs, 102a, 102b and 102c, are associated with a single second reflector 706. Alternatively (not shown), each LED may have a separate second reflector for a total of three second reflectors. LEDs 102a, 102b and 102c have the same structure and properties as LED 102 described previously in side-emitting illumination system 100. The three LEDs may each emit the same color of internally generated light or the three LEDs may emit more than one color of light. For example, if the three LEDs each emit a different color of light, the reflection of the three colors of light from the second reflector 706 in side-emitting illumination system 700 will partially mix the three colors and improve the color uniformity of the light exiting output aperture 714. However, in the example shown in FIGS. 10A-10C, complete and uniform mixing will not occur. For example, if LED 102a emits red light, LED 102b emits green light and LED 102c emits blue light, the side-emitting illumination system 700 will emit predominantly red light from the side of the output aperture 714 nearest LED 102a, predominantly green light from the side of the output aperture 714 nearest LED 102b and predominantly blue light from the side of the output aperture 714 nearest LED 102c. In order to improve light mixing, LEDs 102a, 102b and 102c should be positioned close together and the area of the second reflector 706 should be larger than the total output areas of LEDs 102a, 102b and 102c. Increasing the area of the second reflector 706 will improve light mixing.

First reflector 704 is fabricated from the same materials as first reflector 104 described previously. Second reflector 706 is fabricated from the same materials as second reflector 106 described previously. The second reflector 706 is illustrated in FIG. 10A to have a rectangular shape, but a rectangular shape is not required.

Waveguides 712a and 712b have the same properties as waveguide 612 described previously. The waveguides 712a and 712b are fabricated from transparent solid materials such as the materials listed for waveguide 612. Waveguide 712a has input surface 718a. Waveguide 712b has input surface 718b. Waveguides 712a and 712b as well as the planar element 702 can be fabricated as a single piece of material. For example, since the waveguides 712a and 712b, along with planar element 702, have a uniform cross-section as shown in FIGS. 10A and 10C, the three elements can be fabricated by an extrusion process as a single long plastic piece that can be cut into multiple pieces as desired.

Figure 11A:
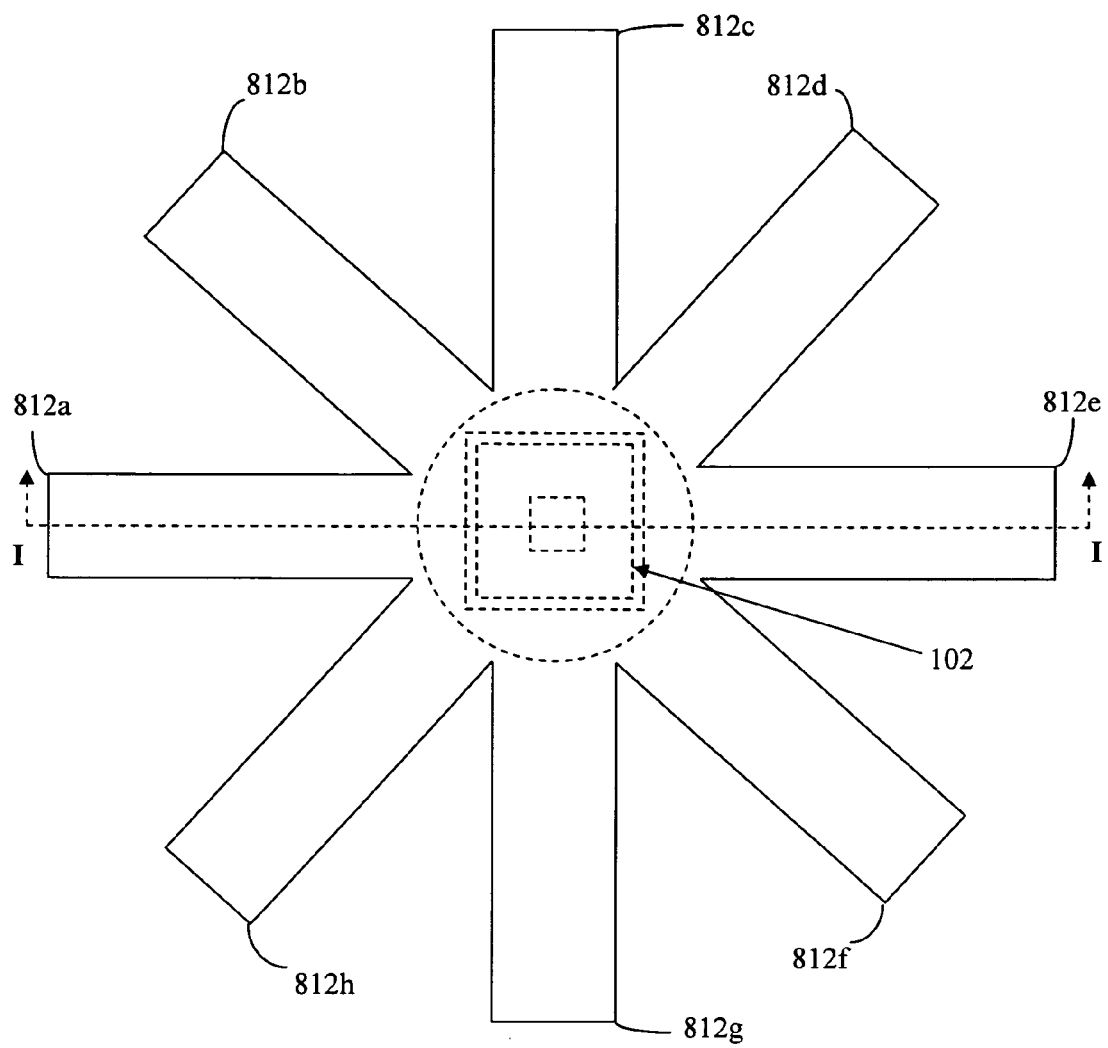
FIG. 11A is a top plan view of an embodiment of a side-emitting illumination system of this invention that includes eight waveguides and one LED.
Figure 11B:
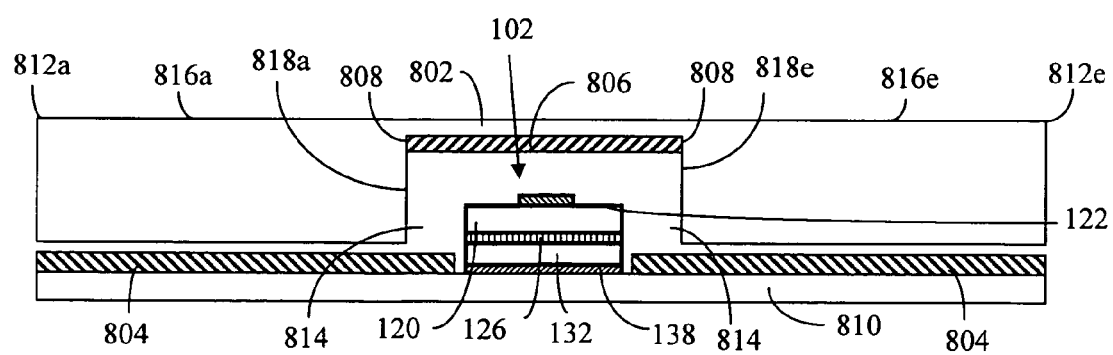
FIG. 11B is a cross-sectional side view along the I-I plane of the side-emitting illumination system illustrated in FIG. 11A.

Another embodiment of this invention is side-emitting illumination system 800 illustrated in plan view in FIG. 11A. FIG. 11B illustrates a cross-sectional view along the I-I plane of the side-emitting illumination system 800 shown in FIG. 11A. Side-emitting illumination system 800 in FIGS. 11A-11B is similar to illumination system 600 illustrated in FIGS. 8A-8E except that side-emitting illumination system 800 includes one LED 102 and eight waveguides. The eight waveguides are labeled 812a, 812b, 812c, 812d, 812e, 812f, 812g and 812h.

Side-emitting illumination system 800 is comprised of LED 102, first reflector 804, a single second reflector 806, eight waveguides 812a, 812b, 812c, 812d, 812e, 812f, 812g and 812h, output aperture 814 and supporting means that hold and separate the second reflector 806 from the first reflector 804. The supporting means include a planar element 802 that is attached to and joins waveguides 812a, 812b, 812c, 812d, 812e, 812f, 812g and 812h. The supporting means also includes a base 810. The first reflector 804 is attached to base 810. The second reflector 806 is attached to planar element 802.

The number of waveguides in side-emitting illumination system 800 was chosen to be eight waveguides as an illustrative example. Side-emitting illumination system 800 may have more than eight waveguides or less than eight waveguides. The number of waveguides is preferably chosen so that the input surfaces of all the waveguides substantially fill the area of the output aperture 814 of side-emitting illumination system 800.

LED 102 has been described previously. First reflector 804 is fabricated from the same materials as first reflector 104 described previously. Second reflector 806 is fabricated from the same materials as second reflector 106 described previously. The second reflector 806 is illustrated in FIG. 10A to have a circular shape, but a circular shape is not required. Other possible shapes for second reflector 806 include, but are not limited to, a square, a rectangle, a polygon and an ellipse.

The waveguides 812a, 812b, 812c, 812d, 812e, 812f, 812g and 812h can be fabricated from any solid material that is transparent to the internally generated light emitted by the active region 126 of LED 102. The waveguides transport light by total internal reflection. Possible materials for the waveguides include, but are not limited to, inorganic glasses such as silicon dioxide and plastics such as silicones, polymethylmethacrylate, fluoroacrylates, polystyrene and polycarbonate. Preferred waveguide materials are flexible polymer optical fibers made from materials that include, but are not limited to, silicones, polymethylmethacrylate and fluoroacrylates. More preferred waveguide materials are flexible polymer optical fibers that are fabricated by a drawing process in order to reduce internal scattering losses. The drawn polymer optical fibers may be made from materials that include, but are not limited to, polymethylmethacrylate and fluoroacrylates. The optical fibers may have a cross-sectional shape that is round, elliptical, square or rectangular.

Each waveguide has a separate input surface. Waveguide 812a has input surface 818a. Waveguide 812b has input surface 818b. Waveguide 812c has input surface 818c. Waveguide 812d has input surface 818d. Waveguide 812e has input surface 818e. Waveguide 812f has input surface 818f. Waveguide 812g has input surface 818g. Waveguide 812h has input surface 818h.

The side-emitting illumination system 800 directs light to the sides of LED 102, through the output aperture 814 located around the sides of LED 102 and through the input surfaces of the waveguides. Once the light is inside the waveguides, optional light extracting elements (not shown) within the waveguide structures can redirect the light approximately perpendicular to the plane of the waveguides. The light extraction elements can control the amount of light output along the length of each waveguide. Example extraction elements include, but are not limited to, grooves, roughened areas, white-painted areas, polarization-dependent elements or subwavelength features placed along the surfaces of the waveguides. Side-emitting illumination systems of this type that include elements to redirect light through the top surface of the illumination system are suitable as backlights for LCD panels.

Figure 12:
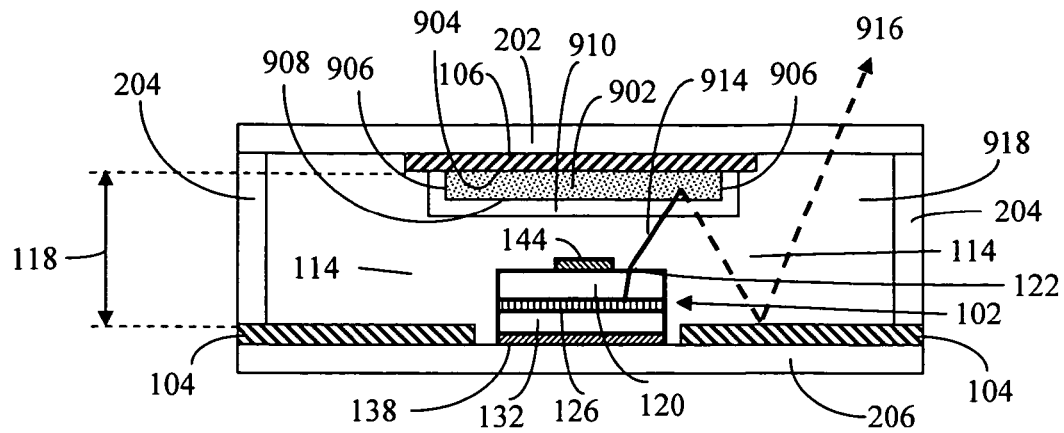
FIG. 12 is a cross-sectional side view of an embodiment of a side-emitting illumination system of this invention that includes a wavelength conversion layer disposed on the second reflector.
Figure 13:
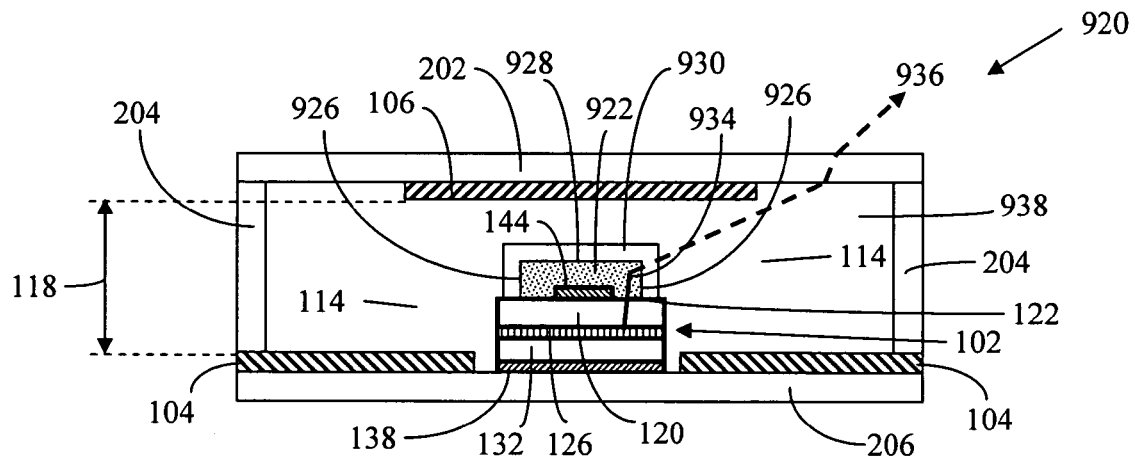
FIG. 13 is a cross-sectional side view of an embodiment of a side-emitting illumination system of this invention that includes a wavelength conversion layer disposed on the LED.
Figure 14:
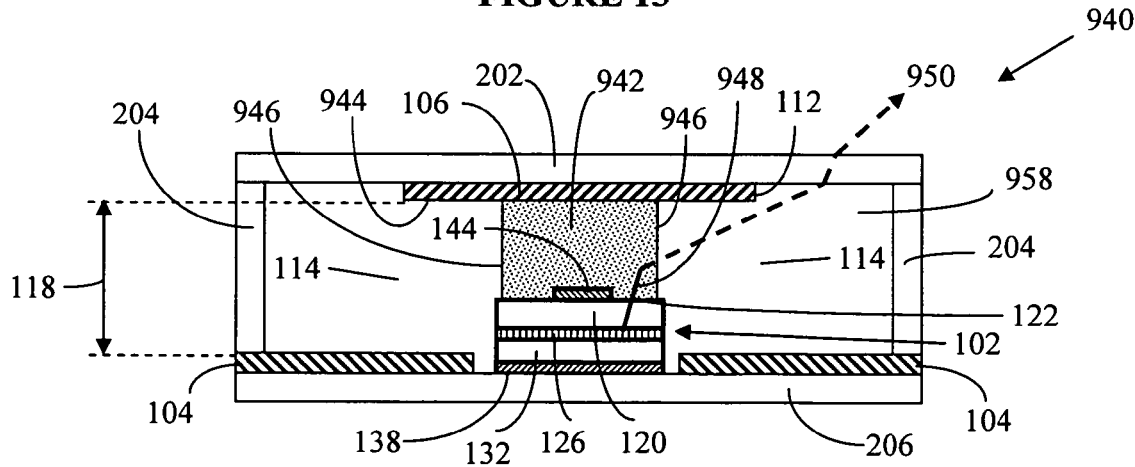
FIG. 14 is a cross-sectional side view of an embodiment of a side-emitting illumination system of this invention that includes a wavelength conversion layer disposed in the region between the first reflector and the second reflector and that surrounds the LED.

FIGS. 12-14 illustrate other embodiments of this invention that further comprise a wavelength conversion layer. Side-emitting illumination system 900 is illustrated in cross-section in FIG. 12. Side-emitting illumination system 900 is similar to illumination system 200 illustrated in FIGS. 2A-2B except that side-emitting illumination system 900 includes a wavelength conversion layer 902 and an optional transparent overcoat layer 910.

Side-emitting illumination system 900 is comprised of LED 102, first reflector 104, second reflector 106, output aperture 114, wavelength conversion layer 902, optional transparent overcoat layer 910 and supporting means that hold and separate the second reflector 106 from the first reflector 104. The supporting means include a planar transparent element 202, edge supports 204 and a base 206. The edge supports 204 are preferably transparent or reflective. The first reflector 104 is attached to base 206. The second reflector 106 is attached to planar transparent element 202. LED 102, first reflector 104, second reflector 106, output aperture 114, planar transparent element 202, edge supports 204 and base 206 have been described previously.

The wavelength conversion layer 902 is disposed on surface 904 of second reflector 106. The wavelength conversion layer has side surfaces 906 and bottom surface 908. For illustrative purposes, the wavelength conversion layer 902 is illustrated in FIG. 12 to only partially cover surface 904. The partial coverage prevents any wavelength-converted light emitted from the side surfaces 906 of the wavelength conversion layer 902 from exiting side-emitting illumination system 900 in a vertical direction. However, wavelength conversion layer 902 may also completely cover surface 904 if the wavelength conversion layer is thin enough to minimize any light emitted from the side surfaces 906. The wavelength conversion layer 902 converts at least part the internally generated light of a first color emitted by the active region 126 of LED 102 into light of a second color, different than the first color.

The wavelength conversion layer 902 is comprised of a phosphor material, a quantum dot material or a plurality of such materials. The wavelength conversion layer may further comprise a transparent host material into which the phosphor material or the quantum dot material is dispersed. Wavelength conversion layers that contain powdered phosphor materials can scatter light. When wavelength conversion layer 902 scatters light, it can also transmit and reflect portions of the scattered light.

Phosphor materials are typically optical inorganic materials doped with ions of lanthanide (rare earth) elements or, alternatively, ions such as chromium, titanium, vanadium, cobalt or neodymium. The lanthanide elements are lanthanum, cerium, praseodymium, neodymium, promethium, samarium, europium, gadolinium, terbium, dysprosium, holmium, erbium, thulium, ytterbium and lutetium. Optical inorganic materials include, but are not limited to, sapphire ($Al_2O_3$), gallium arsenide (GaAs), beryllium aluminum oxide ($BeAl_2O_4$), magnesium fluoride ($MgF_2$), indium phosphide (InP), gallium phosphide (GaP), yttrium aluminum garnet (YAG or $Y_3Al_5O_{12}$), terbium-containing garnet, yttrium-aluminum-lanthanide oxide compounds, yttrium-aluminum-lanthanide-gallium oxide compounds, yttrium oxide ($Y_2O_3$), calcium or strontium or barium halophosphates $(Ca,Sr,Ba)_5(PO_4)_3(Cl,F)$, the compound $CeMgAl_{11}O_{19}$, lanthanum phosphate ($LaPO_4$), lanthanide pentaborate materials ($(lanthanide)(Mg,Zn)B_5O_{10}$), the compound $BaMgAl_{10}O_{17}$, the compound $SrGa_2S_4$, the compounds $(Sr,Mg,Ca,Ba)(Ga,Al,In)_2S_4$, the compound SrS, the compound ZnS and nitridosilicate. There are several exemplary phosphors that can be excited at 250 nm or thereabouts. An exemplary red emitting phosphor is $Y_2O_3:Eu^{3+}$. An exemplary yellow emitting phosphor is $YAG:Ce^{3+}$. Exemplary green emitting phosphors include $CeMgAl_{11}O_{19}:Tb^{3+}$, $((lanthanide)PO_4:Ce^{3+},Tb^{3+})$ and $GdMgB_5O_{10}:Ce^{3+},Tb^{3+}$. Exemplary blue emitting phosphors are $BaMgAl_{10}O_{17}:Eu^{2+}$ and $(Sr,Ba,Ca)_5(PO_4)_3Cl:Eu^{2+}$. For longer wavelength LED excitation in the 400-450 nm wavelength region or thereabouts, exemplary optical inorganic materials include yttrium aluminum garnet (YAG or $Y_3Al_5O_{12}$), terbium-containing garnet, yttrium oxide ($Y_2O_3$), $YVO_4$, $SrGa_2S_4$, $(Sr,Mg,Ca,Ba)(Ga,Al,In)_2S_4$, SrS, and nitridosilicate. Exemplary phosphors for LED excitation in the 400-450 nm wavelength region include $YAG:Ce^{3+}$, $YAG:Ho^{3+}$, $YAG:Pr^{3+}$, $SrGa_2S_4:Eu^{2+}$, $SrGa_2S_4:Ce^{3+}$, $SrS:Eu^{2+}$ and nitridosilicates doped with $Eu^{2+}$.

Quantum dot materials are small particles of inorganic semiconductors having particle sizes less than about 30 nanometers. Exemplary quantum dot materials include, but are not limited to, small particles of CdS, CdSe, ZnSe, InAs, GaAs and GaN. Quantum dot materials can absorb light at one wavelength and then re-emit the light at different wavelengths that depend on the particle size, the particle surface properties, and the inorganic semiconductor material.

The transparent host materials include polymer materials and inorganic materials. The polymer materials include, but are not limited to, acrylates, polystyrene, polycarbonate, fluoroacrylates, perfluoroacrylates, fluorophosphinate polymers, fluorinated polyimides, polytetrafluoroethylene, fluorosilicones, sol-gels, epoxies, thermoplastics, thermosetting plastics and silicones. Fluorinated polymers are especially useful at ultraviolet wavelengths less than 400 nanometers and infrared wavelengths greater than 700 nanometers owing to their low light absorption in those wavelength ranges. Exemplary inorganic materials include, but are not limited to, silicon dioxide, optical glasses and chalcogenide glasses.

A single type of phosphor material or quantum dot material may be incorporated in the wavelength conversion layer 902 or a mixture of phosphor materials and quantum dot materials may be incorporated into the wavelength conversion layer. Utilizing a mixture of more than one such material is advantageous if a broad spectral emission range is desired.

Optionally, a transparent overcoat layer 910 covers side surfaces 906 and bottom surface 908 of wavelength conversion layer 902. Transparent overcoat layer 910 prevents moisture and/or oxygen from reaching wavelength conversion layer 902. Some types of phosphors such as sulfide materials, for example, are susceptible to damage from moisture. Overcoat layer 910 can be fabricated from any transparent material that blocks moisture and/or oxygen from reaching wavelength conversion layer 902. Example overcoat layer materials include inorganic materials such as silicon dioxide, silicon nitride or aluminum oxide, polymer materials or hybrid polymer/inorganic layers. Preferred overcoat materials are silicon dioxide and silicon nitride.

In this embodiment, preferably the second reflector 106 and/or the planar transparent element 202 are impervious to moisture and/or oxygen. Alternatively, the supporting means, including planar transparent element 202, edge supports 204 and base 206, can provide a sealed enclosure that can protect the wavelength conversion layer 902 from moisture and/or oxygen. The interior 918 of side-emitting illumination system 900 can be then be filled with an inert atmosphere or evacuated. The inert atmosphere and vacuum are optically transparent to the light of a first color and the light of a second color.

In another alternative design, a sealed transparent enclosure (not shown) can be placed around side-emitting illumination system 900 in order to prevent degradation of the wavelength conversion layer by moisture or oxygen. The sealed transparent enclosure may be, for example, a glass envelope that is filled with an inert gas or evacuated. The inert atmosphere and vacuum are optically transparent to the light of a first color and the light of a second color.

Example light rays 914 and 916 illustrate the operation of side-emitting illumination system 900. Internally generated light ray 914 of a first color is emitted by active region 126 of LED 102 and directed to surface 122. Light ray 914 of a first color is transmitted by surface 122 and is directed to transparent overcoat layer 910. Light ray 914 of a first color is transmitted by transparent overcoat layer 910 and is directed into wavelength conversion layer 902. Wavelength conversion layer 902 converts light ray 914 of a first color into light ray 916 of a second color. The second color is different than the first color. The light of a second color can be emitted in any direction from the point of wavelength conversion. Light ray 916 of a second color is directed through transparent overcoat layer 910 and directed through output aperture 114 to first reflector 104. Light ray 916 of a second color is reflected by first reflector 104 and is directed to planar transparent element 202. Light ray 916 of a second color is transmitted through planar transparent element 202 and exits side-emitting illumination system 900.

Another embodiment of this invention is side-emitting illumination system 920 illustrated in cross-section in FIG. 13. Side-emitting illumination system 920 is similar to illumination system 200 illustrated in FIGS. 2A-2B except that side-emitting illumination system 920 includes a wavelength conversion layer 922 and an optional transparent overcoat layer 930.

Side-emitting illumination system 920 is comprised of LED 102, first reflector 104, second reflector 106, output aperture 114, wavelength conversion layer 922, optional transparent overcoat layer 930 and supporting means that hold and separate the second reflector 106 from the first reflector 104. The supporting means include a planar transparent element 202, edge supports 204 and a base 206. The first reflector 104 is attached to base 206. The second reflector 106 is attached to planar transparent element 202. LED 102, first reflector 104, second reflector 106, output aperture 114, planar transparent element 202, edge supports 204 and base 206 have been described previously.

The wavelength conversion layer 922 is disposed on surface 122 of LED 102. The wavelength conversion layer has side surfaces 926 and top surface 928. The wavelength conversion layer 922 converts the internally generated light of a first color emitted by the active region 126 of LED 102 into light of a second color, different than the first color. For illustrative purposes, the wavelength conversion layer 922 does not completely cover surface 122 of LED 102. Alternatively, the wavelength conversion layer can cover the entire surface 122 of LED 102. Changing the coverage of the wavelength conversion layer on surface 122 changes the ratio of the amount of light of a first color to the amount of light of second color exiting the output aperture 114. Since wavelength conversion layer 922 also covers first reflecting electrode 144 of LED 102, a pathway (not shown) must be provided to allow the fabrication of an electrical connection to first reflecting electrode 144.

The wavelength conversion layer 922 is comprised of a phosphor material, a quantum dot material or a plurality of such materials. The wavelength conversion layer 922 may further comprise a transparent host material into which the phosphor material or the quantum dot material is dispersed. Example phosphor materials, quantum dot materials and transparent host materials have been listed previously for wavelength conversion layer 902. Wavelength conversion layers that contain powdered phosphor materials can scatter light. When wavelength conversion layer 922 scatters light, it can also transmit and reflect portions of the scattered light.

Optionally, a transparent overcoat layer 930 covers side surfaces 926 and top surface 928 of wavelength conversion layer 922. Transparent overcoat layer 930 prevents moisture and/or oxygen from reaching wavelength conversion layer 922. Some types of phosphors such as sulfide materials, for example, are susceptible to damage from moisture. Overcoat layer 930 can be fabricated from any transparent material that blocks moisture and/or oxygen from reaching wavelength conversion layer 922. Example overcoat layers have been listed previously for wavelength conversion layer 902.

Alternatively, the supporting means, including planar transparent element 202, edge supports 204 and a base 206, can provide a sealed enclosure that can protect the wavelength conversion layer 922 from moisture and/or oxygen. The interior 938 of side-emitting illumination system 920 can be then be filled with an inert atmosphere or evacuated. The inert atmosphere and vacuum are optically transparent to the light of a first color and the light of a second color.

In another alternative design, a sealed transparent enclosure (not shown) can be placed around side-emitting illumination system 920 in order to prevent degradation of the wavelength conversion layer by moisture or oxygen. The sealed transparent enclosure may be, for example, a glass envelope that is filled with an inert gas or evacuated. The inert atmosphere and vacuum are optically transparent to the light of a first color and the light of a second color.

Example light rays 934 and 936 illustrate the operation of side-emitting illumination system 920. Internally generated light ray 934 of a first color is emitted by active region 126 of LED 102 and directed to surface 122. Light ray 934 of a first color is transmitted by surface 122 and is directed into wavelength conversion layer 922. Wavelength conversion layer 922 converts light ray 934 of a first color into light ray 936 of a second color. The second color is different than the first color. The light of a second color can be emitted in any direction from the point of wavelength conversion. Light ray 936 of a second color is directed through transparent overcoat layer 930 and directed through output aperture 114 to planar transparent element 202. Light ray 936 of a second color is transmitted through planar transparent element 202 and exits side-emitting illumination system 920.

Another embodiment of this invention is side-emitting illumination system 940 illustrated in cross-section in FIG. 14. Side-emitting illumination system 940 is similar to illumination system 200 illustrated in FIGS. 2A-2B except that side-emitting illumination system 940 includes a wavelength conversion layer 942.

Side-emitting illumination system 940 is comprised of LED 102, first reflector 104, second reflector 106, output aperture 114, wavelength conversion layer 942 and supporting means that hold and separate the second reflector 106 from the first reflector 104. The supporting means include a planar transparent element 202, edge supports 204 and a base 206. The first reflector 104 is attached to base 206. The second reflector 106 is attached to planar transparent element 202. LED 102, first reflector 104, second reflector 106, output aperture 114, planar transparent element 202, edge supports 204 and base 206 have been described previously.

The wavelength conversion layer 942 spans the gap between surface 122 of LED 102 and surface 944 of second reflector 106. Wavelength conversion layer 942 has side surfaces 946. The wavelength conversion layer 942 converts the internally generated light of a first color emitted by the active region 126 of LED 102 into light of a second color, different than the first color. Since wavelength conversion layer 942 also covers first reflecting electrode 144 of LED 102, a pathway (not shown) must be provided to allow the fabrication of an electrical connection to first reflecting electrode 144.

The wavelength conversion layer 942 is comprised of a phosphor material, a quantum dot material or a plurality of such materials. The wavelength conversion layer 942 may further comprise a transparent host material into which the phosphor material or the quantum dot material is dispersed. Example phosphor materials, quantum dot materials and transparent host materials have been listed previously for wavelength conversion layer 902. Wavelength conversion layers that contain powdered phosphor materials can scatter light. When wavelength conversion layer 942 scatters light, it can also transmit and reflect portions of the scattered light.

As noted previously, some types of phosphors such as sulfide materials, for example, are susceptible to damage from moisture. Optionally, the supporting means, including planar transparent element 202, edge supports 204 and a base 206, can provide a sealed enclosure that can protect the wavelength conversion layer 942 from moisture and/or oxygen. The interior 958 of side-emitting illumination system 940 can be then be filled with an inert atmosphere or evacuated. The inert atmosphere and vacuum are optically transparent to the light of a first color and the light of a second color.

In another alternative design, a sealed transparent enclosure (not shown) can be placed around side-emitting illumination system 940 in order to prevent degradation of the wavelength conversion layer by moisture or oxygen. The sealed transparent enclosure may be, for example, a glass envelope that is filled with an inert gas or evacuated. The inert atmosphere and vacuum are optically transparent to the light of a first color and the light of a second color.

Example light rays 948 and 950 illustrate the operation of side-emitting illumination system 940. Internally generated light ray 948 of a first color is emitted by active region 126 of LED 102 and directed to surface 122. Light ray 948 of a first color is transmitted by surface 122 and is directed into wavelength conversion layer 942. Wavelength conversion layer 942 converts light ray 948 of a first color into light ray 950 of a second color. The second color is different than the first color. The light of a second color can be emitted in any direction from the point of wavelength conversion. Light ray 950 of a second color is directed through side surface 946 of wavelength conversion layer 942 and directed through output aperture 114 to planar transparent element 202. Light ray 950 of a second color is transmitted through planar transparent element 202 and exits side-emitting illumination system 940.

While the invention has been described in conjunction with specific embodiments and examples, it is evident to those skilled in the art that many alternatives, modifications and variations will be apparent in light of the foregoing description. Accordingly, the invention is intended to embrace all such alternatives, modifications and variations as fall within the spirit and scope of the appended claims.

What is claimed is:

1. An side-emitting illumination system, comprising:
  a light emitting diode having
    a first doped semiconductor layer having an output surface;
    a second doped semiconductor layer, said second doped semiconductor layer and said first doped semiconductor layer having opposite n and p conductivity types;
    an active region interposed between said first doped semiconductor layer and said second doped semiconductor layer, said active region in electrical contact with said first doped semiconductor layer and said second doped semiconductor layer;
    a first reflecting electrode in electrical contact with said first doped semiconductor layer;
    a second reflecting electrode in electrical contact with said second doped semiconductor layer;
  a first reflector surrounding said light emitting diode;
  a second reflector separated from and opposing said first reflector and said light emitting diode and said second reflector having an edge;
  an output aperture formed by said first reflector and by said edge of said second reflector;
  a supporting means which holds and separates said second reflector from said first reflector;
  wherein said active region of said light emitting diode emits internally generated light through said output surface of said first doped semiconductor layer when a voltage is applied between said first reflecting electrode and said second reflecting electrode;
  wherein said internally generated light emitted through said output surface of said first doped semiconductor layer is directed to said second reflector or is directed through said output aperture;
  wherein said internally generated light reflected by said second reflector is redirected through said output aperture or is redirected to said first reflector or is recycled back to said light emitting diode as externally incident light; and
  wherein a portion of said externally incident light recycled back to said light emitting diode is reflected by said first reflecting electrode and said second reflecting electrode of said light emitting diode, thereby increasing the effective brightness of said light emitting diode, and is directed through said output aperture, thereby increasing the output brightness and efficiency of said side-emitting illumination system.

2. A side-emitting illumination system as in claim 1, wherein said second reflector is a diffuse reflector.

3. A side-emitting illumination system as in claim 1, wherein said second reflector is a specular reflector.

4. A side-emitting illumination system as in claim 2, wherein said second reflector is a substantially planar surface.

5. A side-emitting illumination system as in claim 4, wherein the separation distance between said second reflector and said first reflector is less than 5 millimeters.

6. A side-emitting illumination system as in claim 5, wherein the separation distance between said second reflector and said first reflector is less than 2 millimeters.

7. A side-emitting illumination system as in claim 2, wherein said second reflector is an inverted peak or is curved, wherein the separation distance between said second reflector and said first reflector increases from the center of said second reflector to said edge of said second reflector.

8. A side-emitting illumination system as in claim 1, further comprising a waveguide, wherein said waveguide has an input surface that substantially spans said output aperture, wherein said waveguide transmits through said input surface said internally generated light from said output surface of said light emitting diode, said internally generated light reflected by said second reflector and said externally incident light reflected from said first reflecting electrode and said second reflecting electrode of said light emitting diode and wherein said waveguide transmits light by total internal reflection.

9. A side-emitting illumination system as in claim 8, wherein said waveguide further includes light extracting elements that extract light from said waveguide to be transmitted out of said waveguide.

10. A side-emitting illumination system as in claim 8, wherein said waveguide is a flexible waveguide.

11. A side-emitting illumination system as in claim 10, wherein said flexible waveguide is a plurality of said flexible waveguides.

12. A side-emitting illumination system as in claim 1, wherein said light emitting diode is a plurality of said light emitting diodes.

13. A side-emitting illumination system as in claim 12, wherein said plurality of said light emitting diodes emit more than one color of light.

14. A side-emitting illumination system as in claim 1, wherein said light emitting diode reflects said externally incident light with a reflectivity greater than 40 percent.

15. A side-emitting illumination system as in claim 14, wherein said light emitting diode reflects said externally incident light with a reflectivity greater than 50 percent.

16. A side-emitting illumination system as in claim 15, wherein said light emitting diode reflects said externally incident light with a reflectivity greater than 60 percent.

17. A side-emitting illumination system as in claim 1, wherein said supporting means is a transparent material spanning the region between said second reflector and said first reflector and wherein said supporting means surrounds said light emitting diode.

18. A side-emitting illumination system as in claim 1, further comprising a wavelength conversion layer that converts a portion of the internally generated light of a first color into light of a second color, different than said first color.

19. A side-emitting illumination system as in claim 18, wherein said wavelength conversion layer is disposed on said output surface of said light emitting diode.

20. A side-emitting illumination system as in claim 18, wherein said wavelength conversion layer is disposed on said second reflector.

21. A side-emitting illumination system as in claim 18, wherein said wavelength conversion layer spans the region between said second reflector and said first reflector.

22. A side-emitting illumination system as in claim 1, wherein said first reflector is a specular reflector.

23. A side-emitting illumination system as in claim 1, wherein said first reflector is a diffuse reflector.

* * * * *